United States Patent
Kanzawa et al.

(10) Patent No.: US 8,445,885 B2
(45) Date of Patent: May 21, 2013

(54) NONVOLATILE MEMORY ELEMENT HAVING A THIN PLATINUM CONTAINING ELECTRODE

(75) Inventors: Yoshihiko Kanzawa, Osaka (JP); Satoru Mitani, Osaka (JP); Zhiqiang Wei, Osaka (JP); Takeshi Takagi, Kyoto (JP); Koji Katayama, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/132,058

(22) PCT Filed: Dec. 1, 2009

(86) PCT No.: PCT/JP2009/006515
§ 371 (c)(1), (2), (4) Date: May 31, 2011

(87) PCT Pub. No.: WO2010/064410
PCT Pub. Date: Jun. 10, 2010

(65) Prior Publication Data
US 2011/0233510 A1    Sep. 29, 2011

(30) Foreign Application Priority Data
Dec. 4, 2008    (JP) .................................. 2008-310201

(51) Int. Cl.
*H01L 29/02* (2006.01)
(52) U.S. Cl.
USPC ..... 257/2; 257/3; 257/4; 257/5; 257/E29.002; 438/102; 438/103
(58) Field of Classification Search
USPC .................. 257/1–5, E29.002; 438/102–103
See application file for complete search history.

(56) References Cited

U.S. PATENT DOCUMENTS
6,473,332 B1    10/2002    Ignatiev et al.
2004/0114429 A1    6/2004    Ehiro et al.
(Continued)

FOREIGN PATENT DOCUMENTS
KR    1020060083368    *    7/2006
WO    WO 2006/075574 A1    7/2006
WO    WO 2007/004843 A1    1/2007
WO    WO 2008/117371 A1    10/2008

OTHER PUBLICATIONS
Baek, I. G., et al., "Highly Scalable Non-volatile Resistive Memory using Simple Binary Oxide Driven by Asymmetric Unipolar Voltage Pulses", Tech. Digest IEDM, 2004, 587+, 4 pages.
(Continued)

*Primary Examiner* — Jami M Valentine
(74) *Attorney, Agent, or Firm* — McDermott Will & Emery LLP

(57) ABSTRACT

A nonvolatile memory element includes first and second electrodes, and a resistance variable layer disposed therebetween. At least one of the first and second electrodes includes a platinum-containing layer. The resistance variable layer includes a first oxygen-deficient transition metal oxide layer which is not physically in contact with the platinum-containing layer and a second oxygen-deficient transition metal oxide layer which is disposed between the first oxygen-deficient transition metal oxide layer and the platinum-containing layer and is physically in contact with the platinum-containing layer. When oxygen-deficient transition metal oxides included in the first and second oxygen-deficient transition metal oxide layers are expressed as $MO_x$ and $MO_y$, respectively, $x<y$ is satisfied. The platinum-containing layer has a thickness which is not less than 1 nm and not more than 23 nm.

5 Claims, 15 Drawing Sheets

U.S. PATENT DOCUMENTS

| | | |
|---|---|---|
| 2005/0275064 A1 | 12/2005 | Li et al. |
| 2006/0097288 A1 | 5/2006 | Baek et al. |
| 2007/0221975 A1 | 9/2007 | Li et al. |
| 2007/0267675 A1 | 11/2007 | Cho et al. |
| 2008/0200003 A1 | 8/2008 | Hong et al. |
| 2008/0278990 A1 | 11/2008 | Kumar et al. |
| 2009/0097300 A1 | 4/2009 | Ishihara et al. |
| 2009/0121823 A1 | 5/2009 | Kawano et al. |
| 2009/0218565 A1 | 9/2009 | Kawano et al. |
| 2009/0224224 A1 | 9/2009 | Fujii et al. |
| 2009/0257271 A1 | 10/2009 | Noshiro |
| 2009/0283736 A1* | 11/2009 | Kanzawa et al. .................. 257/2 |
| 2011/0059576 A1 | 3/2011 | Cho et al. |

OTHER PUBLICATIONS

Chen, X, et al. "A Study of the Symmetry Properties and Multi-State Nature of Perovskite Oxide-Based Electrical Pulse Induced Resistance-Change Devices", New Journal of Physics, Oct. 9, 2006, pp. 1-13, (8) 229, IOP Publishing Ltd and Deutsche Physikalische Gesellschaft.

International Search Report issued in International Application No. PCT/JP2009/006515 dated Mar. 9, 2010.

International Preliminary Report on Patentability issued in International Application No. PCT/JP2009/006515, Apr. 2011.

* cited by examiner

NONVOLATILE MEMORY ELEMENT HAVING A THIN PLATINUM CONTAINING ELECTRODE

RELATED APPLICATIONS

This application is the U.S. National Phase under 35 U.S.C. §371 of International Application No. PCT/JP2009/006515, filed on Dec. 1, 2009, which in turn claims the benefit of Japanese Application No. 2008-310201, filed on Dec. 4, 2008, the disclosures of which Applications are incorporated by reference herein.

TECHNICAL FIELD

The present invention relates to a nonvolatile memory element. More particularly, the present invention relates to a resistance variable nonvolatile memory element which changes its resistance values in response to electric signals applied thereto.

BACKGROUND ART

With recent advancement of digital technologies, electronic equipment such as portable information devices and home information appliances have been developed to provide higher functionality. For this reason, demands for an increase in a capacity of a nonvolatile memory element, reduction in a write electric power in the memory element, reduction in write/read time in the memory element, and higher retention property of the memory element are now increasing.

Under the circumstances in which there are such demands, it is said that there is a limitation on miniaturization of the existing flash memory using a floating gate. Accordingly, in recent years, an attention has been paid to a novel resistance variable nonvolatile memory element using a resistance variable layer as a material of a memory section.

FIG. 13 is a view showing a schematic configuration of a conventional resistance variable nonvolatile memory element. As shown in FIG. 13, a conventional nonvolatile memory element 600 has a very simple structure in which a resistance variable layer 602 is sandwiched between a lower electrode layer 601 and an upper electrode layer 603. Upon application of a predetermined electric pulse having a voltage with a magnitude of a certain threshold or larger, between the upper and lower electrodes, a resistance value between the upper and lower electrodes changes to a high-resistance value or to a low-resistance value (element performs a resistance changing operation). By corresponding these resistance values to numeric values (data), respectively, data is stored.

Because of such a simple structure and operation, further miniaturization and cost reduction of the resistance variable nonvolatile memory element are expected. Since changing between the high-resistance state and the low-resistance state occurs in a very short time of 100 ns or less in some cases, the resistance variable nonvolatile memory element has attracted an attention in terms of its high-speed operation, and a variety of proposals therefor have been heretofore made.

Recently, in particular, there have been numerous proposals made for resistance variable nonvolatile memory elements using metal oxides for the resistance variable layer 602. The resistance variable nonvolatile memory elements using such metal oxides are roughly classified into two major categories depending on the material used for the resistance variable layer.

One category is resistance variable nonvolatile memory elements disclosed in Patent Literature 1 or the like, which use perovskite materials ($Pr_{(1-x)}Ca_xMnO_3$ (PCMO), $LaSrMnO_3$ (LSMO), $GdBaCo_xO_y$ (GBCO), etc.), as the resistance variable layer.

The other category is resistance variable nonvolatile memory elements disclosed in Patent Literature 2 or the like, which use binary transition metal oxides (compound consisting of transition metal and oxygen). Since the binary transition metal oxides have a very simple composition as compared to aforesaid perovskite materials, composition control and layer deposition in manufacturing are relatively easy. In addition, the binary transition metal oxides have an advantage that they are relatively highly compatible with semiconductor manufacturing process steps. For these reasons, these days, the resistance variable nonvolatile memory elements using the binary transition metal oxides are under intensive study.

For example, Patent Literature 2 discloses resistance variable elements using as the resistance variable materials, oxides in stoichiometry of transition metals such as nickel (Ni), niobium (Nb), titanium (Ti), zirconium (Zr), hafnium (Hf), cobalt (Co), iron (Fe), copper (Cu), and chromium (Cr), and oxides (hereinafter referred to as oxygen-deficient transition metal oxides) which are transition metal oxides and are less in oxygen content (atom ratio: ratio of the number of oxygen atoms to a total number of atoms, hereinafter the same occur) than the oxides in their stoichiometric compositions.

Patent Literature 3 discloses a resistance variable element using as a resistance variable material, oxygen-deficient tantalum (Ta) oxide. In this literature, it is reported that an element which performs a resistance changing operation is attained in a range of $0.8 \leq x \leq 1.9$ (44.4% to 65.5% in terms of oxygen concentration) when an oxygen-deficient Ta oxide is expressed as $TaO_x$.

Now, the oxygen-deficient oxides will be described in more detail. For example, in the case of Ta, $Ta_2O_5$ is known as an oxide in stoichiometry. $Ta_2O_5$ contains Ta atoms and O atoms in a ratio of 2:5 (atom ratio, hereinafter the same occurs). An oxygen content (atom ratio, hereinafter, the same occurs) of $Ta_2O_5$ is 71.4 atm %. Oxides having oxygen contents lower than 71.4 atm % are referred to as the oxygen-deficient oxides. The oxygen-deficient oxide in the present example is an oxide of Ta, and therefore may be referred to as an oxygen-deficient Ta oxide.

Patent Literature 4 discloses an example in which a resistance variable layer has a structure in which a surface region of titanium nitride is oxidized to form a titanium oxide ($TiO_2$) crystalline layer of a nanometer order.

As stated above, a variety of materials are disclosed as the resistance variable layer materials. However, most of electrode materials sandwiching the resistance variable layer are precious metals, for example, gold (Au), silver (Ag), platinum (Pt), palladium (Pd), rhodium (Rh), iridium (Ir), ruthenium (Ru), and osmium (Os). Non-Patent Literature 1 recites that the use of precious metals as the electrode material enable a resistance changing operation to occur more easily than the use of polysilicon or non-metal as the electrode material.

Among precious metals, in particular, Pt is used most frequently. All of Patent Literature 1 to Patent Literature 4 disclose resistance variable nonvolatile memory elements using Pt as electrodes. Pt may be regarded as one of most desirable materials as the electrode of the resistance variable nonvolatile memory element using a metal oxide layer.

In the examples disclosed in the cited prior arts, the thickness of the electrode layer comprising Pt is 100~150 nm in Patent Literature 3 and 100 nm in Patent Literature 3.

Patent Literature 5 discloses a resistive memory element including a lower electrode, a resistive memory layer formed on the lower electrode, and an upper electrode formed on the resistive memory layer, and adapted to store a high-resistance state and a low-resistance state and switch between the high-resistance state and the low-resistance state by application of voltages, in which the lower electrode or the upper electrode includes a first conductive layer formed at the resistive memory layer side and comprising precious metal, and a second conductive layer which is in contact with the first conductive layer, is larger in thickness than the first conductive layer, and comprises a non-precious metal. According to Patent Literature 5, a thickness (layer thickness) of the electrode layer comprising precious metal is not less than 10 nm and not more than 20 nm.

CITATION LISTS

Patent Literature

Patent Literature 1: Japanese Laid-Open Patent Application Publication No. 2005-340806
Patent Literature 2: Japanese Laid-Open Patent Application Publication No. 2006-140464
Patent Literature 3: International Publication No. 2008/059701
Patent Literature 4: Japanese Laid-Open Patent Application Publication No. 2007-180202
Patent Literature 5: International Publication No. 2008/117371

Non-Patent Literature

Non-Patent Literature 1: I. G Baek et al., Tech. Digest IEDM 2004, page 587

SUMMARY OF THE INVENTION

Technical Problem

In the conventional resistance variable nonvolatile memory element including the electrode layer comprising Pt, there has been a need for further improvement of reproducibility of its electric characteristic (particularly, initial resistance) and reliability (durability) of its operation.

The present invention has been developed to solve the above described problems, and an object of the present invention is to provide a resistance variable nonvolatile memory element having improved reproducibility of an electric characteristic and improved operation reliability.

Solution to Problem

The present inventors studied intensively to solve the above described problem, and found out the following.

FIGS. 14A and 14B are transmission electron microscope (TEM) photographs showing cross-sections of nonvolatile memory elements each including a resistance variable layer comprising an oxygen-deficient Ta oxide. FIG. 14A shows a photograph in a case where a maximum temperature in process steps is 400 degrees C. and FIG. 14B shows a photograph in a case where a maximum temperature in process steps is 100 degrees C.

The element shown in FIG. 14A was manufactured by stacking a first oxygen-deficient Ta oxide layer 704a with a thickness of about 23 nm, a second oxygen-deficient Ta oxide layer 705a with a thickness of about 8 nm, and an upper electrode layer 709a comprising a Pt layer with a thickness of about 80 nm, in this order, on a lower electrode layer 703a comprising a Pt layer with a thickness of about 50 nm. The oxygen content of the first oxygen-deficient Ta oxide layer 704a was set higher than the oxygen content of the second oxygen-deficient Ta oxide layer 705a. The element of FIG. 14A was manufactured by a process technique for manufacturing a semiconductor device. The maximum temperature in a heating step of the process steps was set to about 400 degrees C. 400 degrees C. is a temperature at a thermal treatment (sintering process) required for fabricating electrode wires comprising, for example, copper or aluminum.

The thickness of each layer was measured based on the transmission electron microscope (TEM) photograph.

From a thorough study of FIG. 14A, it was clear that when heating was conducted at 400 degrees C., minute hillocks (portions surrounded by circles in the photograph) comprising Pt were formed so as to project in an upward direction in the photograph from the lower electrode layer 703a and in a downward direction in the photograph from the upper electrode layer 709a, i.e., from the upper electrode toward the resistance variable layer and from the lower electrode toward the resistance variable layer. Most of the hillocks extended from regions near grain boundaries of the upper and lower Pt layers. It should be especially notable that the hillocks extending from the upper electrode layer 709a reached approximately a half of the thickness of the second oxygen-deficient Ta oxide layer.

The manufacturing method of the element shown in FIG. 14B was identical to that of the element of FIG. 14A except that the maximum temperature in the heating step of the process steps was set to about 100 degrees C. in the manufacturing method of the element of FIG. 14B. As shown in FIG. 14B, the hillocks comprising Pt did not appear. To be more specific, the hillocks extending from the lower electrode layer 703b toward the first oxygen-deficient Ta oxide layer 704b or the hillocks extending from the upper electrode layer 709b toward the second oxygen-deficient Ta oxide layer 705b did not appear.

For each of the elements, initial resistance (resistance value between the upper electrode layer and the lower electrode layer just after the completion of sample manufacturing process steps including the heating step) was measured. The measurement value of the sample (having Pt hillocks) shown in FIG. 14A was about $10^2 \Omega$, while the measurement value of the sample (having no Pt hillocks) shown in FIG. 14B was about $10^8 \Omega$. Thus, the initial resistance of the sample having the hillocks was 6-digit lower.

As described later, the second oxygen-deficient Ta oxide layer is provided to regulate the initial resistance of the element and plays a very important role to enable the element to perform a resistance changing operation stably. A designed initial resistance could not be attained, if the hillocks shown in FIG. 14A are present. The hillocks makes the corresponding portion of the second oxygen-deficient Ta oxide layer substantially thinner, and makes a resistance value of the overall element lower than that of an element having no hillocks.

If the hillocks are formed with high reproducibility, then the resistance value can be designed in light of a degree to which the hillocks make contribution. Actually, however, it is difficult to control a formation density, a size, etc., of the hillocks with high reproducibility. Therefore, the hillocks may cause a reduction of reproducibility of the electric characteristic of the element.

When a voltage is applied between the upper electrode layer and the lower electrode layer under the state of FIG. 14A, an electric field or a current concentrates on hillocks regions. If a voltage is applied repeatedly under this condition, a portion of the oxygen-deficient Ta oxide layer, which portion is present in the vicinity of the hillock regions, would be destroyed, and the upper electrode layer and the lower electrode layer would be short-circuited, which may lead to a situation where no resistance changing operation occurs. Thus, the hillocks might also be a cause of reduction of reliability (durability) of the element.

In view of the above, it is expected that the reproducibility of the electric characteristic of the element and reliability of the operation of the element can be improved by suppressing the formation of the hillocks extending from the electrode toward the oxygen-deficient Ta oxide layer.

As a mechanism of the formation of the hillocks, the following suggestion was made. It was presumed that a change in the Pt layer in the heating step of the sample manufacturing process steps was a factor of the formation of the hillocks. The hillocks might be formed by migration of Pt atoms under the condition in which the Pt layer reached a high-temperature state. It was presumed that because migration tended to occur along the grain boundaries of the Pt layer, the hillocks grew from the grain boundaries of the Pt layer.

Furthermore, the inventors confirmed whether or not a similar problem would occur when Hf was used as transition metal included in the resistance variable layer, instead of Ta. FIGS. 15A and 15B are transmission electron microscope (TEM) photographs showing cross-sections of nonvolatile memory elements each including a resistance variable layer comprising an oxygen-deficient Hf oxide, in which FIG. 15A shows a photograph in a case where a maximum temperature in process steps is 400 degrees C. and FIG. 15B shows a photograph in a case where a maximum temperature in process steps is 100 degrees C.

The element of FIG. 15A was manufactured in such a manner that an oxygen-deficient Hf oxide layer 706c with a thickness of about 30 nm, and an upper electrode layer 709c comprising Pt with a thickness of about 75 nm were stacked in this order on a lower electrode layer 703c comprising W (tungsten) with a thickness of about 150 nm. The element of FIG. 15A was also manufactured by a process technique for manufacturing a semiconductor device. The maximum temperature in the heating step of the process steps was set to about 400 degrees C.

From a thorough study of FIG. 15A, it was clear that when heating was conducted at 400 degrees C., broad hillocks comprising Pt (portions surrounded by circles in photograph) projected in a downward direction in the photograph from the upper electrode layer 709c, i.e., from the upper electrode layer toward the resistance variable layer.

The element of FIG. 15B was manufactured in such a manner that the oxygen-deficient Hf oxide layer 706c with a thickness of about 30 nm and the upper electrode layer 709c comprising a Pt layer with a thickness of about 75 nm were stacked in this order on the lower electrode layer 703c comprising a W layer with a thickness of about 150 nm. The maximum temperature in the heating step of the process steps for the element of FIG. 15B was set to about 100 degrees C. As shown in FIG. 15B, the hillocks comprising Pt did not appear in the element for which the maximum temperature in the process steps was set to about 100 degrees C.

From the above results, it was presumed that, in the nonvolatile memory element including the Pt layer (electrode layer) with a larger thickness and the oxygen-deficient transition metal oxide as constituents, the Pt hillocks were more likely to be formed, due to exposure to high-temperature atmosphere, which occurred irrespective of the kind of the transition metal.

Although the electrode consisted of a single element of Pt in the above Example, it was presumed that similar hillocks were formed even in a material (alloy material substantially having a property of Pt) comprising Pt as a major component. That is, it was considered that a need for improvement of process reproducibility and reliability existed when platinum was used as the electrode material of the nonvolatile memory element.

It is expected that formation of the hillocks could be suppressed by omitting the heating step in manufacturing of the element. However, in general semiconductor process steps, the heating step with a temperature of about several hundreds degrees C. is absolutely requisite, and setting of the upper limit of the heating temperature in element manufacturing process steps to about 100 degrees C. is not realistic.

The inventors further studied based on the above findings, and discovered that the formation of the hillocks could be suppressed by thinning the electrode layer comprising platinum.

To solve the above described problem, a nonvolatile memory element of the present invention comprises a first electrode; a second electrode; and a resistance variable layer disposed between the first electrode and the second electrode, resistance values of the resistance variable layer reversibly changing in response to electric signals applied between the first electrode and the second electrode; the resistance variable layer comprising an oxygen-deficient transition metal oxide which is a transition metal oxide and is less in oxygen content which is an atom ratio than an oxide having a stoichiometric composition; at least one of the first electrode and the second electrode including a platinum-containing layer comprising platinum; the resistance variable layer including at least a first oxygen-deficient transition metal oxide layer which is not physically in contact with the platinum-containing layer and a second oxygen-deficient transition metal oxide layer which is disposed between the first oxygen-deficient transition metal oxide layer and the platinum-containing layer and is physically in contact with the platinum-containing layer; x<y being satisfied when an oxygen-deficient transition metal oxide included in the first oxygen-deficient transition metal oxide layer is expressed as $MO_x$, and an oxygen-deficient transition metal oxide included in the second oxygen-deficient transition metal oxide layer is expressed as $MO_y$, and the platinum-containing layer having a thickness which is not less than 1 nm and not more than 23 nm and being physically in contact with the resistance variable layer.

In such a configuration, it is possible to provide a resistance variable nonvolatile memory element which can suppress formation of hillocks extending from the Pt layer to the resistance variable layer and have improved reproducibility of an electric characteristic and improved operation reliability. A region of the resistance variable layer which is in contact with the Pt layer and in which its resistance value changes, becomes a relatively high-resistance state. Therefore, a "pre-processing" step may be dispensed with.

In the above nonvolatile memory element, the transition metal may be tantalum, and the platinum-containing layer may have a thickness which is not less than 1 nm and not more than 10 nm.

The above and further objects, features and advantages of the present invention will more fully be apparent from the following detailed description of preferred embodiments with accompanying drawings.

Advantageous Effects of the Invention

The present invention is configured as described above and achieves advantages that a resistance variable nonvolatile memory element having improved reproducibility of an electric characteristic and improved operation reliability is provided.

BRIEF DESCRIPTION OF THE DRAWINGS

FIG. 2A to 2C are TEM photographs of cross-sections of elements formed in the present Example, in which FIG. 2A shows the cross-section of an element A, FIG. 2B shows the cross-section of an element B, and FIG. 2C shows the cross-section of an element C.

FIG. 4A to 4D are views showing results of verification as to whether or not the element A, the element B and the element C perform a resistance changing operation in Example of Embodiment 1 of the present invention, in which FIG. 4A is a view showing a resistance changing operation of an element O, FIG. 4B is a view showing a resistance changing operation of the element A, FIG. 4C is a view showing a resistance changing operation of the element B, and FIG. 4D is a view showing a resistance changing operation of the element C.

FIGS. 5A and 5B are views showing results of research about to what degree Pt is deposited to form a layer (continuous layer) covering an entire surface, using X-ray photoelectron spectroscopy (XPS), in which FIG. 5A is a view showing a relationship between corresponding thicknesses of a Pt layer (thickness derived based on a sputtering rate and a sputtering time of Pt) and a binding energy, and FIG. 5B is a view showing peak positions of main peaks (near 27 eV) of respective spectra of FIG. 5A which are plotted with respect to the thickness of the Pt layer.

FIGS. 7A and 7B are views showing a relationship between voltages of electric pulses and resistance values in an element manufactured in Experiment Example 3 in Embodiment 1 of the present invention, in which FIG. 7A is a view showing a relationship between the number of times the electric pulses are applied and the resistance values, and FIG. 7B is a view showing the voltages of the respective electric pulses.

FIG. 10A to 10C are views showing results of verification as to whether or not the element A', the element B' and the element C' perform a resistance changing operation in the Example of Embodiment 2 of the present invention, in which FIG. 10A is a view showing a resistance changing operation of the element A', FIG. 10B is a view showing a resistance changing operation of the element B', and FIG. 10C is a view showing the resistance changing operation of the element C'.

FIG. 11A shows Modified Example 1 and FIG. 11B shows Modified Example 2.

FIG. 12A shows Modified Example 3, FIG. 12B shows Modified Example 4, and FIG. 12C shows Modified Example 5.

FIGS. 14A and 14B are transmission electron microscope (TEM) photographs showing cross-sections of a nonvolatile memory element including a resistance variable layer comprising an oxygen-deficient Ta oxide, in which FIG. 14A shows a photograph in a case where a maximum temperature in process steps is 400 degrees C. and FIG. 14B shows a photograph in a case where a maximum temperature in process steps is 100 degrees C.

FIGS. 15A and 15B are transmission electron microscope (TEM) photographs showing cross-sections of a nonvolatile memory element including a resistance variable layer comprising an oxygen-deficient Hf oxide, in which FIG. 15A shows a photograph in a case where a maximum temperature in process steps is 400 degrees C. and FIG. 15B shows a photograph in a case where a maximum temperature in process steps is 100 degrees C.

DESCRIPTION OF EMBODIMENTS

Hereinafter, preferred embodiments of the present invention will be described with reference to the drawings.

Embodiment 1

Device Configuration

Figure 1:
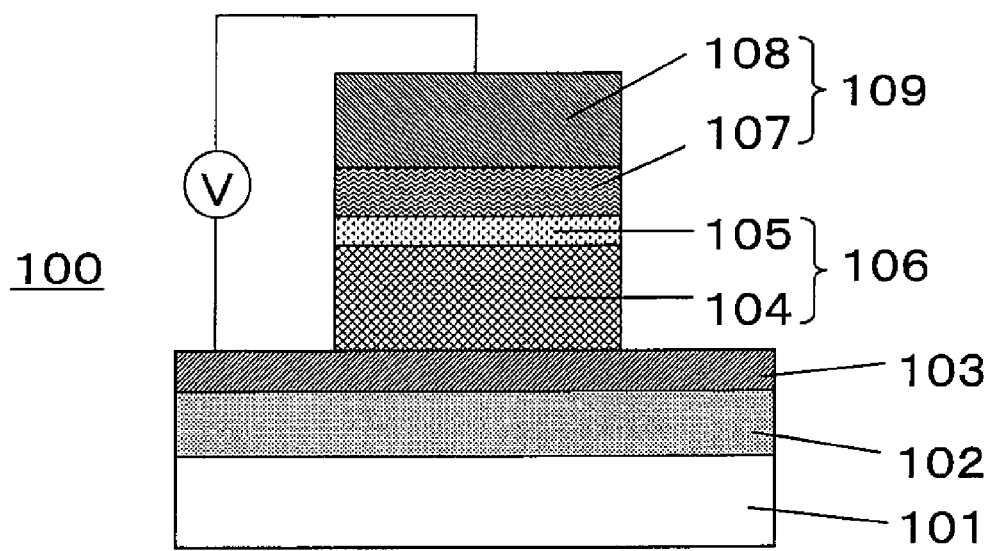
FIG. 1 is a cross-sectional view showing an exemplary schematic configuration of a nonvolatile memory element according to Embodiment 1 of the present invention.

FIG. 1 is a cross-sectional view showing an exemplary schematic configuration of a nonvolatile memory element according to Embodiment 1 of the present invention.

As shown in FIG. 1, a nonvolatile memory element 100 of this embodiment includes a substrate 101, an oxide layer 102, a lower electrode layer 103 (first electrode), a resistance variable layer 106, and an upper electrode layer 109 (second electrode) which are stacked in this order. The resistance variable layer 106 includes a first oxygen-deficient Ta oxide layer 104 (first oxygen-deficient transition metal oxide layer) formed on the lower electrode layer 103 and a second oxygen-deficient Ta oxide layer 105 (second oxygen-deficient transition metal oxide layer) formed on the first oxygen-deficient Ta oxide layer 104. The upper electrode layer 109 includes a Pt layer 107 (platinum-containing layer) formed on the second oxygen-deficient Ta oxide layer 105, and an electric conductor layer 108 formed on the Pt layer 107.

The nonvolatile memory element 100 has a structure in which upper and lower adjacent layers are physically in contact with each other. To be specific, for example, the second oxygen-deficient Ta oxide layer 105 and the Pt layer 107 are physically in contact with each other. Hereinafter, the same applies to upper and lower adjacent layers in Figures.

When an oxygen-deficient Ta oxide included in the first oxygen-deficient Ta oxide layer 104 is expressed as $TaO_x$ and an oxygen-deficient Ta oxide included in the second oxygen-deficient Ta oxide layer 105 is expressed as $TaO_y$, $0<x<2.5$, $0<y<2.5$, and $x<y$ are satisfied.

As used herein, the oxygen-deficient oxide refers to an oxide which is less in oxygen content (atom ratio: ratio of the number of oxygen atoms to a total number of atoms) than the oxides in stoichiometry. For example, like the example of this embodiment, when the transition metal is Ta, the composition of an oxide in stoichiometry is $Ta_2O_5$ and a ratio in atom number of O to Ta (O/Ta) is 2.5. This follows that in the oxygen-deficient Ta oxide, an atom ratio of O to Ta is larger than 0 and smaller than 2.5.

The Pt layer 107 comprises platinum. Preferably, the Pt layer 107 comprises platinum as a major component. More preferably, the Pt layer 107 consists of platinum.

[Manufacturing Method]

An exemplary manufacturing method of the nonvolatile memory element 100 will be described below.

A substrate made of a monocrystalline silicon is thermally oxidized to form the oxide layer 102 (200 nm in thickness) over the substrate 101. Over the oxide layer 102, the lower electrode layer 103 (40 nm in thickness) comprising TaN is deposited by sputtering.

Over the lower electrode 103, the oxygen-deficient Ta oxide layer (30 nm in thickness) is deposited by sputtering. As the sputtering, a method of sputtering in a gas mixture atmosphere of Ar and $O_2$ using a Ta target may be used. To be more specific, a vacuum degree (back pressure) inside a sputtering apparatus before initiating the sputtering may be about $7 \times 10^{-4}$ Pa, an electric power during the sputtering is 250 W, a total gas pressure which is a sum of a pressure of an argon gas and a pressure of an oxygen gas may be 3.3 Pa, a partial pressure ratio of the oxygen gas may be 3.8%, a set temperature of the substrate may be 30 degrees C., and a deposition time may be seven minutes.

A surface region of the deposited oxygen-deficient Ta oxide layer is oxidized by a plasma oxidization apparatus, thereby forming the uniform oxygen-deficient Ta oxide layer into the first oxygen-deficient Ta oxide layer 104 (about 23 nm in thickness) and the second oxygen-deficient Ta oxide layer 105 (about 8 nm in thickness).

After completion of the oxidization process, the Pt layer 107 is deposited over the second oxygen-deficient Ta oxide layer 105 by sputtering. A range of the thickness of the Pt layer 107 may be, for example, not less than 1 nm and not more than 23 nm. A suitable range of the thickness of the Pt layer will be described later. After deposition of the Pt layer 107, the electric conductor layer 108 (80 nm in thickness) comprising TiAlN is deposited by sputtering. Through the above process steps, the nonvolatile memory element 100 is attained.

Example

1. Manufacturing Method

In the present Example, according to the above described manufacturing method, three kinds of nonvolatile memory elements including Pt layers with thicknesses different from each other were manufactured. The thickness of the Pt layer was 8 nm in the element A, 13 nm in the element B, and 23 nm in the element C.

In the present Example, in addition, the element O including the Pt layer with a thickness of 5 nm was manufactured.

In the present Example, the oxygen-deficient Ta oxide deposited by sputtering had an oxygen content of about 58 atm %, and a thickness of about 30 nm. When the oxygen-deficient Ta oxide was expressed as $TaO_x$, x was 1.38 in the oxygen content of about 58 atm %. When the oxygen-deficient Ta oxide included in the second oxygen-deficient Ta oxide layer was expressed as $TaO_y$, y was 2.47 (oxygen content was about 71 atm %). That is, the oxygen-deficient Ta oxide constituting the second oxygen-deficient Ta oxide layer 105 was slightly deficient in oxygen than $TaO_{2.5}$ ($Ta_2O_5$) which was the oxide in stoichiometry and had a higher resistance value than the oxygen-deficient Ta oxide (x=1.38) constituting the first oxygen-deficient Ta oxide layer 104. The thickness of the first oxygen-deficient Ta oxide layer was 23 nm, while the thickness of the second oxygen-deficient Ta oxide layer was 8 nm. These elements went through heating treatment at 400 degrees C. for 10 minutes in a sintering process step.

The oxygen content of the first oxygen-deficient Ta oxide layer was obtained by measuring and analyzing a sample with a larger thickness manufactured over a wafer having no pattern under similar conditions, by Rutherford Back Scattering Spectrometry (RBS). The oxygen content of the second oxygen-deficient Ta oxide layer was obtained in such a manner that, after deriving a correlation coefficient between RBS and X-ray Reflectometer (XRR), by measuring by XRR, an oxide layer with a small thickness manufactured over a wafer having no pattern under conditions identical to those for the sample measured and analyzed by RBS, the oxygen content of the second oxygen-deficient Ta oxide layer was measured by XRR.

2. Observation Result of Cross-Section

The cross-sections of the elements A, B, and C were observed by TEM.

Figure 2A:
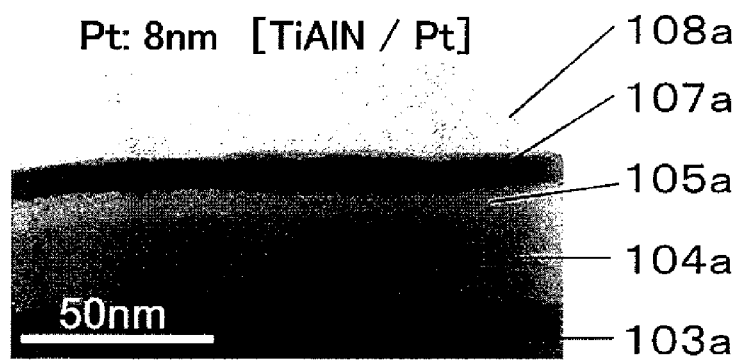
Figure 2B:
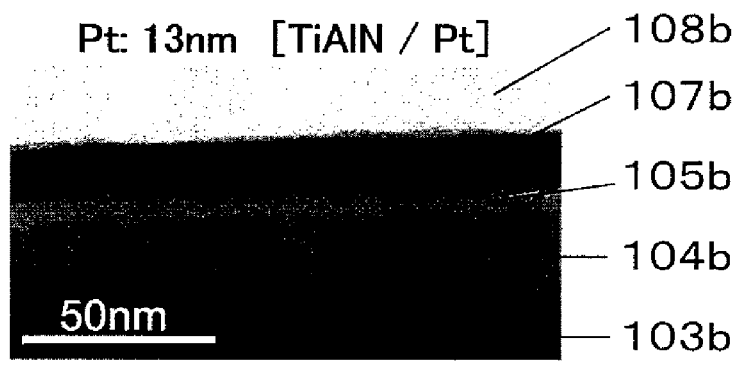
Figure 2C:
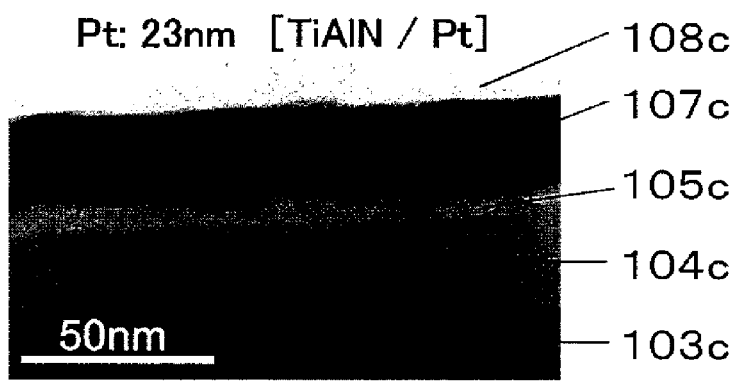

FIG. 2A to 2C are TEM photographs of cross-sections of the elements manufactured in the present Example, in which FIG. 2A shows the cross-section of the element A, FIG. 2B shows the cross-section of the element B, and FIG. 2C shows the cross-section of the element C. These elements had the same structure except for the thickness of the Pt layer. The element A had a structure in which a lower electrode layer 103a, a first oxygen-deficient Ta oxide layer 104a, a second oxygen-deficient Ta oxide layer 105a, a Pt layer 107a, and an electric conductor layer 108a were stacked in this order. The element B had a structure in which a lower electrode layer 103b, a first oxygen-deficient Ta oxide layer 104b, a second oxygen-deficient Ta oxide layer 105b, a Pt layer 107b, and an electric conductor layer 108b were stacked in this order. The element C had a structure in which a lower electrode layer 103c, a first oxygen-deficient Ta oxide layer 104c, a second oxygen-deficient Ta oxide layer 105c, a Pt layer 107c, and an electric conductor layer 108c were stacked in this order.

In each of the elements, the thickness of the first oxygen-deficient Ta oxide layer was 23 nm, and the thickness of the second oxygen-deficient Ta oxide layer was 8 nm.

As can be seen from thorough study of FIG. 2A to 2C, in the element A, no hillocks were formed in the Pt layer 107a. In the element B, concave-convex portions with about 2 nm were formed in the Pt layer 107b, and it seemed that some hillocks were appearing. In a localized portion of the element C, hillocks reached a region in the vicinity of a center of the second oxygen-deficient Ta oxide layer 105c. Nonetheless, the shape of the hillocks was unclear as compared to the shape of the hillocks in the Example (thickness of Pt layer=80 nm) of FIG. 14A.

From the above result, it can be seen that formation of the hillocks can be suppressed significantly by thinning the Pt layer. It can also be seen that this effect diminishes as the thickness of the Pt layer increases.

3. Initial Resistance

Figure 3:
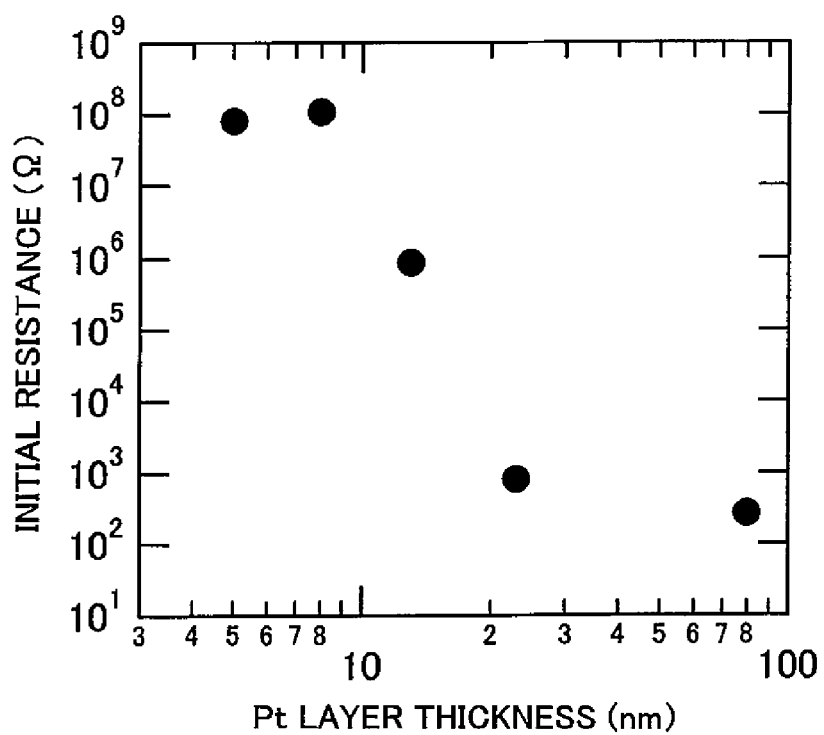
FIG. 3 is a view showing initial resistances of the element A, the element B and the element C which are plotted with respect to the thicknesses of a Pt layer, in Example of Embodiment 1 of the present invention.

FIG. 3 is a view showing initial resistances of the element A, the element B and the element C which are plotted with respect to the thicknesses of the Pt layer, in the Example of Embodiment 1 of the present invention. As a Comparative Example, an initial resistance of a nonvolatile memory element manufactured by depositing only a Pt layer (80 nm) as an upper electrode layer is also plotted in FIG. 3.

FIG. 3 also shows a result of an initial resistance of an element O which is plotted with respect to the thickness of the Pt layer in the Example of Embodiment 1 of the present invention.

The initial resistance refers to a resistance value (resistance value between the lower electrode layer and the upper electrode layer) just after manufacturing the element. To be precise, a resistance value of the element that has undergone manufacturing process steps including a heating step and is not applied with an electric pulse (electric pulse of a voltage sufficiently large to change the resistance value) even once is measured and this resistance value is the initial resistance. The initial resistance was derived by measuring a current flowing by applying a voltage which is as low as 50 mV between the lower electrode layer and the upper electrode layer.

As shown in FIG. 3, the initial resistance of the element A (thickness of Pt layer=8 nm) was very high and about $10^8 \Omega$. This initial resistance was substantially equal to that of the element (element manufactured by setting a temperature in the heating step in the process steps to about 100 degrees C.) shown in FIG. 14B. However, the initial resistance of the element B (thickness of Pt layer=13 nm) was as low as $10^6 \Omega$, while the initial resistance of the element C (thickness of Pt layer=23 nm) was as low as about $800 \Omega$. In contrast, the initial resistance of the element manufactured as the Comparative Example (thickness of Pt layer=80 nm) was about $300 \Omega$. In other words, the initial resistance of the Comparative Example was about a half of that of the element C.

As shown in FIG. 3, the initial resistance of the element O (thickness of Pt layer=5 nm) was very high like the resistance value of the element A and was about $10^8 \Omega$. This resistance value was substantially equal to that of the above described element (element manufactured by setting a temperature in the heating step in the process steps to about 100 degrees C.) shown in FIG. 14B.

It may be presumed that the reduction in the resistance value with an increasing thickness of the Pt layer has a strong correlation with formation of the hillocks or concave-convex portions in the Pt layer. When the Pt layer is thicker, the hillocks (concave-convex portions) of Pt grow into the second oxygen-deficient Ta oxide layer, and make the corresponding portion of the second oxygen-deficient Ta oxide layer effectively thinner. The second oxygen-deficient Ta oxide layer has a higher resistance than the first oxygen-deficient Ta oxide layer. For this reason, the ingress of the Pt hillocks into the second oxygen-deficient Ta oxide layer significantly reduces the initial resistance of the element. The fact that the initial resistance of the element is higher implies that the formation of the Pt hillocks is suppressed more.

As can be seen from FIG. 3, the initial resistances were substantially constant (about several hundreds $\Omega$) when the thicknesses of the Pt layers were larger than 20 nm, and reduction of the resistance value seemed to be saturated. From this result, it is preferable that the thickness of the Pt layer be set to 20 nm or less in order to suppress the Pt hillocks and similar concave-convex portions.

4. Discussion on Hillocks Suppressing Mechanism

The mechanism by which the formation of the hillocks is suppressed by thinning the Pt layer is as follows.

Figure 14A:
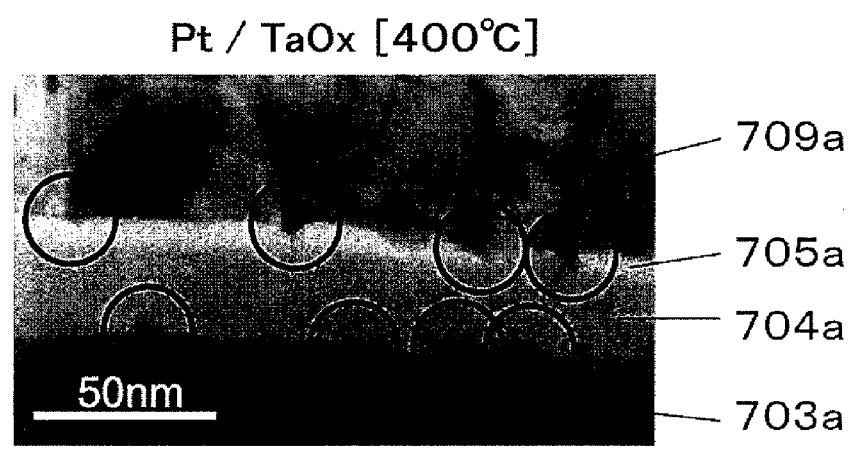
Figure 14B:
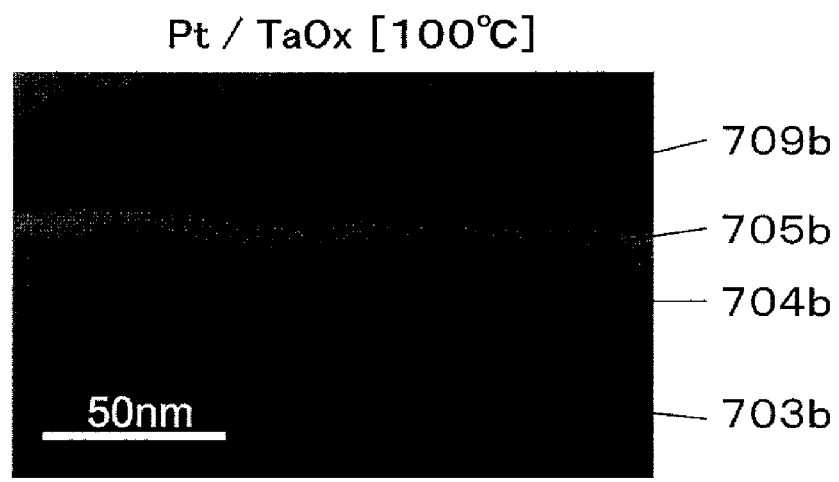
Figure 15A:
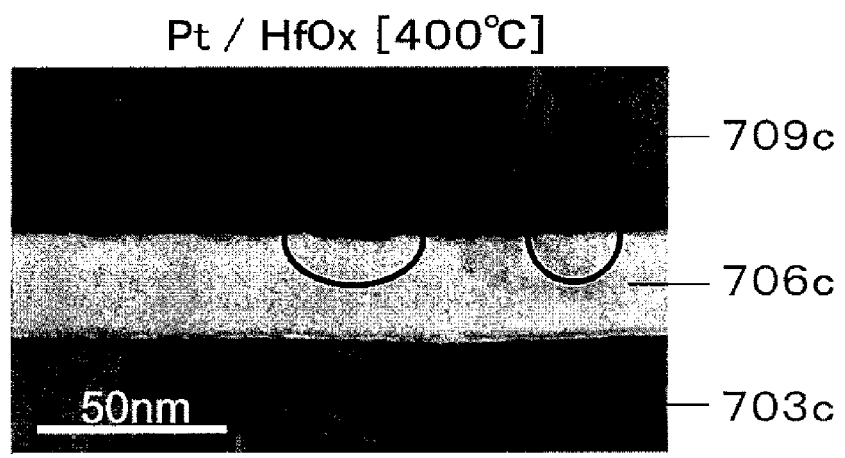
Figure 15B:
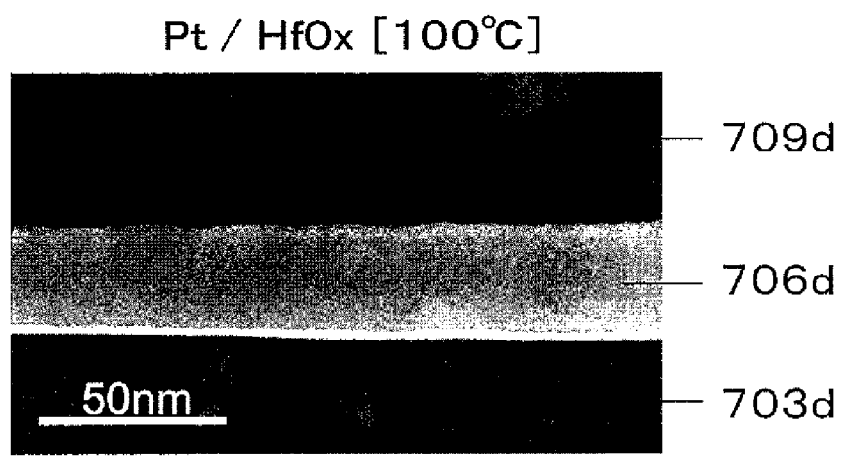

As explained above, it is presumed that the Pt hillocks are formed by migration of the Pt atoms along the grain boundaries present in the Pt layer. If there is no grain boundary, the migration would be less likely to occur and the formation of the hillocks would not occur. In general, in a structure in which metal or the like is deposited on a substrate, grains of crystals grow to a great size, and as a result, clearer grain boundaries appear as the thickness is larger. On the other hand, in the case of a thinner layer, grains do not grow sufficiently, and clear grain boundaries do not appear. This is supported by the fact that gains boundaries observed in FIGS. 14A and 14B are not observed in the examples of FIGS. 2A and 2B. Therefore, in the case of the element A including a very thin Pt layer (about 8 nm), migration of Pt along the grain boundaries do not occur and the hillocks do not appear. However, in the case of the element B and the element C including the Pt layers with larger thicknesses, the grain boundaries are made clear and hillock-like concave-convex portions gradually emerge.

Another factor of suppressing the formation of the hillocks is an amount of Pt atoms. The hillocks are formed by migration of the Pt atoms. It is presumed that as the Pt atoms which will migrate are less in amount, the hillocks are less likely to be formed. Thinning the thickness of the Pt layer like this embodiment is the same as reducing the amount of Pt atoms. That is, it may also be considered that the formation of the hillocks is suppressed in the elements A to C, because the Pt atoms which will migrate are less in amount.

5. Resistance Changing Operation

Figure 4A:
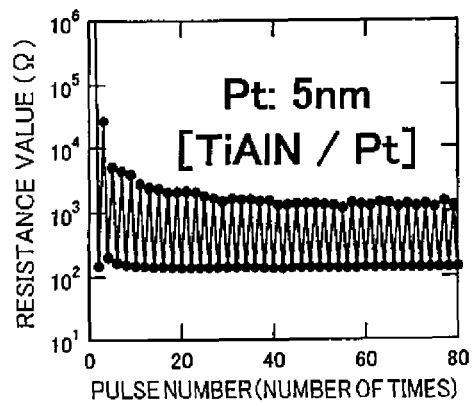
Figure 4B:
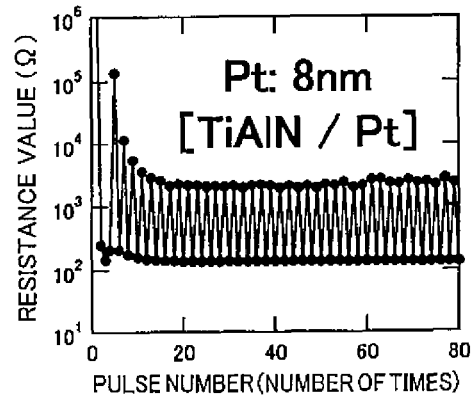
Figure 4C:
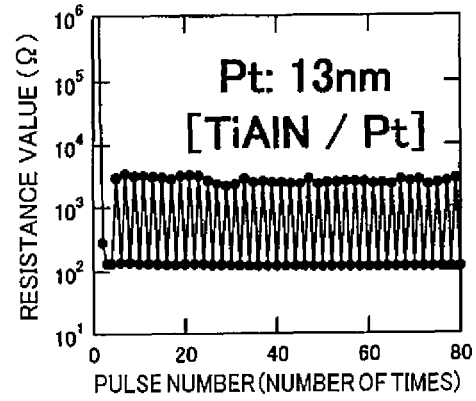
Figure 4D:
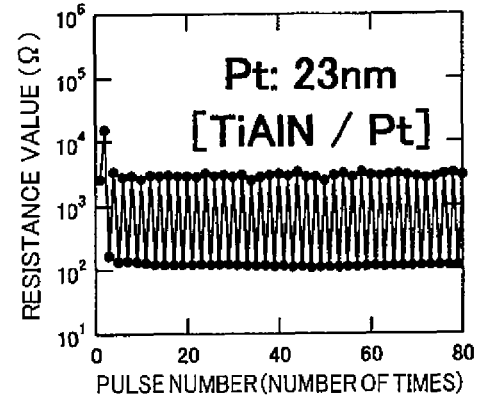

FIG. 4A to 4D are views showing results of verification as to whether or not the element A, the element B and the element C perform a resistance changing operation in the Example of Embodiment 1 of the present invention, in which FIG. 4B is a view showing a resistance changing operation of the element A, FIG. 4C is a view showing a resistance changing operation of the element B, and FIG. 4D is a view showing a resistance changing operation of the element C.

FIG. 4A is a view showing a resistance changing operation of the element O.

Hereinafter, positive and negative voltages are expressed as a voltage of the upper electrode layer on the basis of the lower electrode layer. To be specific, a voltage in a case where a voltage higher than a voltage applied to the lower electrode layer is applied to the upper electrode layer is a positive voltage, whereas a voltage in a case where a voltage lower than a voltage applied to the lower electrode layer is applied to the upper electrode layer is a negative voltage. The voltages were applied by using electric pulses with a pulse width of 100 nsec. The resistance value was derived by measuring a current flowing by applying a voltage as low as 50 mV between the electrodes prior to each electric pulse application.

In the Example of FIG. 4A, the voltages of the electric pulses applied to the element O were as follows: in first application, −3.5V was applied, in second application, +3.6V was applied, in third application: −1.2V was applied, in fourth application, +1.6V was applied, and in fifth and following applications, −1.2V and +1.6V were alternately applied like the third and following applications. In the Example of FIG. 4A, the resistance value (initial resistance) of the element O before first pulse application was $10^6 \Omega$ or more (beyond measurement range of the apparatus) and was in a range outside FIG. 4A. As can be seen from FIG. 4A, the element O exhibited a stable resistance changing operation in such a manner that the resistance value of the element O became about 1500Ω by applying +1.6V and became about 140Ω by applying −1.2V when the pulse number exceeded twenty in number of times.

In the Example of FIG. 4B, the voltages of the electric pulses applied to the element A were as follows: in first application, −1.5V was applied, in second application, +1.7V was applied, in third application: −1.5V was applied, and in fourth and following applications, +1.7V and −1.5V were alternately applied like the second and following applications. In the Example of FIG. 4B, the resistance value (initial resistance) of the element A before the first pulse application was $10^6$Ω or more (beyond measurement range of the apparatus) and was in a range outside FIG. 4B. As can be seen from FIG. 4B, the element A exhibited a stable resistance changing operation in such a manner that the resistance value of the element A became about 3000Ω by applying +1.7V and became about 100Ω by applying −1.5V when the pulse number exceeded ten in number of times.

In the Example of FIG. 4C, the voltages of the electric pulses applied to the element B were as follows: in first application, −1.5V was applied, in second application, +1.7V was applied, in third application: −1.5V was applied, and in fourth and following applications, +1.7V and −1.5V were alternately applied like the second and following applications. In the Example of FIG. 4C, the resistance value (initial resistance) of the element B before first pulse application was $10^6$Ω or more (beyond measurement range of the apparatus) and was in a range outside FIG. 4C. As can be seen from FIG. 4C, the element B exhibited a stable resistance changing operation in such a manner that the resistance value of the element B became about 3000Ω by applying +1.7V and became about 100Ω by applying −1.5V when the pulse number exceeded four in number of times.

In the Example of FIG. 4D, the voltages of the electric pulses applied to the element C were as follows: in first application, +1.7V was applied, in second application, −1.5V was applied, in third application: +1.7V was applied, and in fourth and following applications, −1.5V and +1.7V were alternately applied like the second and following applications. In the Example of FIG. 4D, the resistance value (initial resistance) of the element C before the first pulse application was about 3000Ω. As can be seen from FIG. 4D, the element C exhibited a stable resistance changing operation in such a manner that the resistance value of the element C became about 3000Ω by applying +1.7V and became about 100Ω by applying −1.5V when the pulse number exceeded three in number of times.

Regarding the element of Comparative Example (thickness of Pt layer=80 nm), a resistance changing operation which was substantially similar to the resistance changing operations of the elements A to C was observed, although not shown here.

From the above results, it may be concluded that whether or not the element performs a resistance changing operation do not substantially depend on the thickness of the Pt layer.

Experiment Example 1

Suitable Range of Thickness of Pt Layer

From the study with reference to FIG. 2A to 2C, it was found out by setting the thickness of the Pt layer to 8 nm, the Pt hillocks did not appear at all, while by setting the thickness of the Pt layer to 13 nm and to 23 nm, the hillocks at Pt interface increased. However, the hillocks observed in FIGS. 2B and 2C were somewhat different from the hillocks formed in the element (thickness of Pt layer=80 nm) in the Example of FIG. 14A and should be referred to as concave-convex portions. From this fact, the formation of the hillocks can be suppressed to some extent in the Pt layer with a thickness of 23 nm in the Example of FIG. 2C. Therefore, it may be said that the thickness of the Pt layer is preferably set to 23 nm or less, to suppress the hillocks from being formed.

According to a measurement result of the initial resistances shown in FIG. 3, a trend that the resistance value increased significantly as the thickness of the Pt layer decreased, in a range of 20 nm or less, was observed. However, a trend that when the Pt layer was more than 20 nm in thickness, the corresponding resistance value did not decrease any more and was substantially constant, was observed. It may be presumed that the magnitude of the initial resistance value had a strong correlation with the formation of the Pt hillocks in such a way that hillocks of a greater size were formed as the resistance value was lower. It may be considered that the measurement values of FIG. 3 resulted from the fact that the hillocks grew into the second oxygen-deficient Ta oxide layer with a higher electric resistance and the effective thickness of the second oxygen-deficient Ta oxide layer decreased. In other words, according to the measurement result of the initial resistance of FIG. 3, it may be said that the formation of the hillocks can be suppressed effectively when the thickness of the Pt layer is 20 nm or less and not effectively when the thickness of the Pt layer is more than 20 nm. From this, it may be more preferable that the thickness of the Pt layer be set to 20 nm or less.

The results of FIG. 2A to 2C obtained by mechanical analysis were substantially consistent with the result of FIG. 3 obtained based on the electric characteristic, and the upper limit value of the thickness of the Pt layer which allowed the formation of the hillocks to be suppressed effectively was about 20 nm. From the result of the TEM observation of the cross-section shown in FIG. 2A to 2C, it may be concluded that the thickness of the Pt layer is required to be set to 8 nm or less to completely eliminate a possibility of forming the hillocks.

Subsequently, consideration will be given of a lower limit value of the thickness of the Pt layer.

As stated above, Pt is a material that allows resistance change to occur easily (resistance values to change easily by applying electric pulses). It is more likely that the resistance change occurs by migration of oxygen atoms in the vicinity of an interface between the electrode and the oxygen-deficient Ta oxide layer. As generally known, Pt is a material which acts as a catalyst for a redox reaction. From these facts, it may be presumed comprehensively that in the element of this embodiment, Pt catalytically acts on the oxygen-deficient Ta oxide layer to promote the migration of the oxygen atoms, thereby resulting in a state where a resistance changing operation occurs easily.

In other words, it may be presumed that in the element of this embodiment, the resistance value increases by an event that oxygen is fed to a region of the oxide layer in the vicinity of the interface between the Pt layer and the oxygen-deficient Ta oxide layer (oxidization), while the resistance value decreases by an event that oxygen migrates away from the region of the oxide layer in the vicinity of the interface (reduction). In this phenomenon, Pt may be regarded as performing a catalytic action to lessen an activation energy for enabling the redox reaction to occur in the oxide layer.

In light of the above, it may be said that the Pt layer is required to completely cover an entire surface of the oxygen-deficient Ta oxide layer. If the Pt layer is not in contact with the oxygen-deficient Ta oxide layer continuously and island-like separated Pt-layer covers a localized region of the oxygen-deficient Ta oxide layer, regions exhibiting resistance change are varied depending on sizes of the portions of the island-like Pt layer or a density of them, thereby causing non-uniformity of resistance values.

Figure 5A:
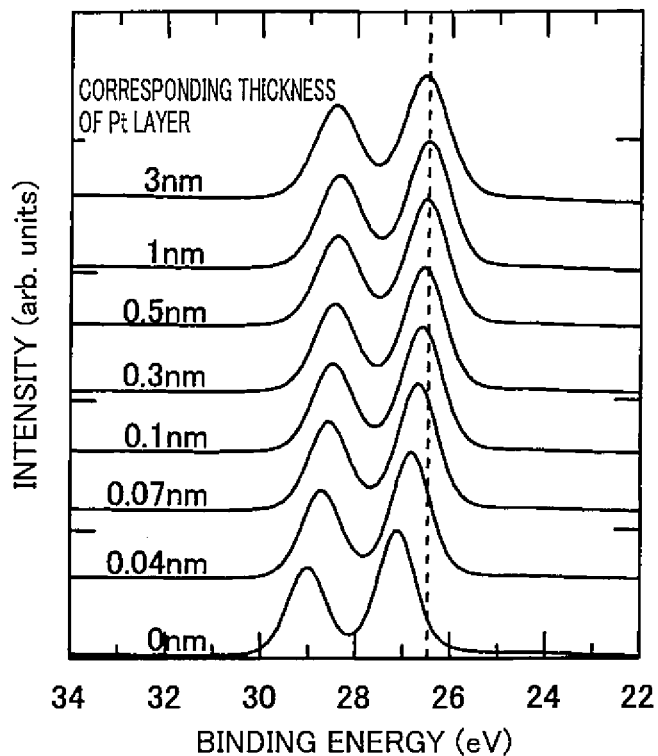
Figure 5B:
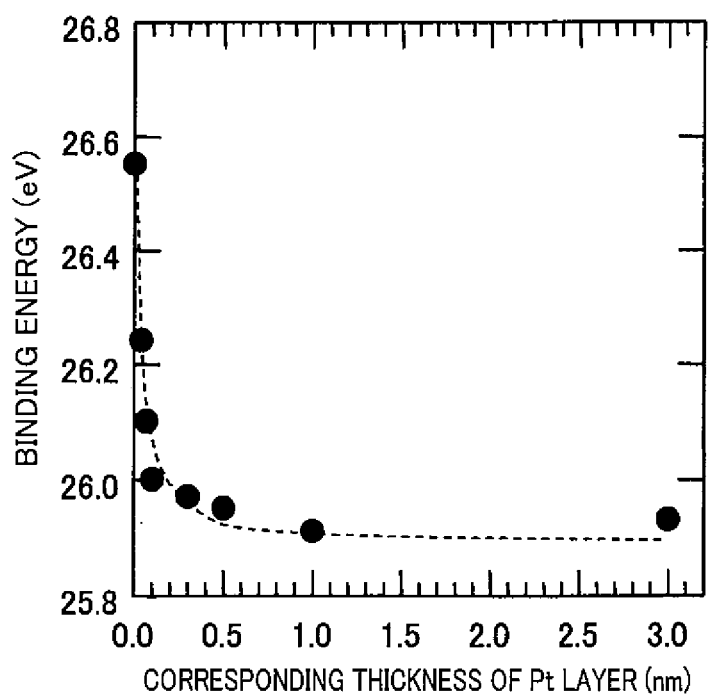

FIGS. 5A and 5B are views showing results of research about to what degree Pt is deposited to form a layer (continuous layer) completely covering an entire surface, using X-ray photoelectron spectroscopy (XPS), in which FIG. 5A is a view showing a relationship between corresponding thicknesses of the Pt layer and a binding energy, and FIG. 5B is a view showing peak positions of main peaks (near 27 eV) of respective spectra which are plotted with respect to the thickness of the Pt layer.

A detailed Experiment method in FIGS. 5A and 5B is as follows.

Initially, the oxygen-deficient Ta oxide layer was deposited over the substrate and its surface was naturally oxidized in atmosphere. Over the oxidized surface of the oxygen-deficient Ta oxide layer, the Pt layer was deposited by sputtering so as to have thicknesses different from each other, and XPS spectra corresponding to the respective thicknesses were measured. The thicknesses of the Pt layer were controlled according to sputtering time. As used herein, the term "corresponding thickness" refers to an imaginary thickness calculated from the sputtering time assuming that the layer thickness is proportional to the sputtering time. When the thickness is larger (continuous layer is formed), the corresponding thickness coincides with an actual thickness. On the other hand, when the thickness is small, the layer does not have an even thickness but is separated like islands, making it difficult to define the thickness. The "corresponding thickness" in the case where the thickness is small may be regarded as substantially coinciding with an average thickness of the Pt layer separated like islands.

FIG. 5A shows how spectrum of 4f electron present in an inner shell of Ta changes according to the thickness of the Pt layer. In FIG. 5A, for the purpose of easier comparison among the respective spectra, horizontal axes are plotted to be shifted in a vertical direction from one another among the respective corresponding thicknesses.

As shown in FIG. 5A, as the thickness of the Pt layer increases, the peak of the 4f electrons of Ta shifts to a low-energy side. Such a shift could be attributed to a change (band bending) in an energy band structure caused by depositing Pt on the Ta oxide layer. The degree to which the peak shifts increases as a ratio of a portion of the surface of the Ta oxide layer which is covered with the Pt layer increases. In a state where the entire surface of the Ta oxide is covered with the Pt layer (the Pt layer is continuous layer), no further peak shift occurs. With reference to FIG. 5A taking this fact into account, the peak shift of the 4f electrons of Ta occurs continuously when the corresponding thickness of the Pt layer is in a range of 0 nm~1 nm. This means that the Pt layer is not a continuous layer but is an island-like discontinuous layer, when the corresponding thickness is in a range less than 1 nm. On the other hand, the Pt layer may be considered to be a continuous layer, when the corresponding thickness is not less than 1 nm.

FIG. 5B is a view showing peak positions of main peaks (near 27 eV) of respective spectra of FIG. 5A which are plotted with respect to the thickness of the Pt layer. As can be seen from FIG. 5B, no peak shift occurs when the corresponding thickness is not less than 1 nm.

From the above results, it can be understood that the Pt layer on the Ta oxide is a continuous layer when the corresponding thickness is not less than 1 nm. Since transition metal oxides have substantially similar characteristics, it may be considered that the Pt layer becomes a continuous layer with a substantially equal thickness even when Pt is deposited on transition metal oxides other than Ta oxide.

In light of the above result and the result of the Example of Embodiment 1, the thickness range of the Pt layer is not less than 1 nm and not more than 23 nm, more suitably not less than 1 nm and not more than 20 nm. The thickness range of the Pt layer is more suitably not less than 1 nm and not more than 13 nm, more suitably not less than 1 nm and not more than 10 nm, and most preferably not less than 1 nm and not more than 8 nm. The lower limit of the thickness range of the Pt layer is 1 nm, more preferably 5 nm, and most preferably 8 nm.

Experiment Example 2

Site of Element where Resistance Change Occurs

In the present Experimental Example, the present inventors studied a site of the element where its resistance value changed.

Figure 6:
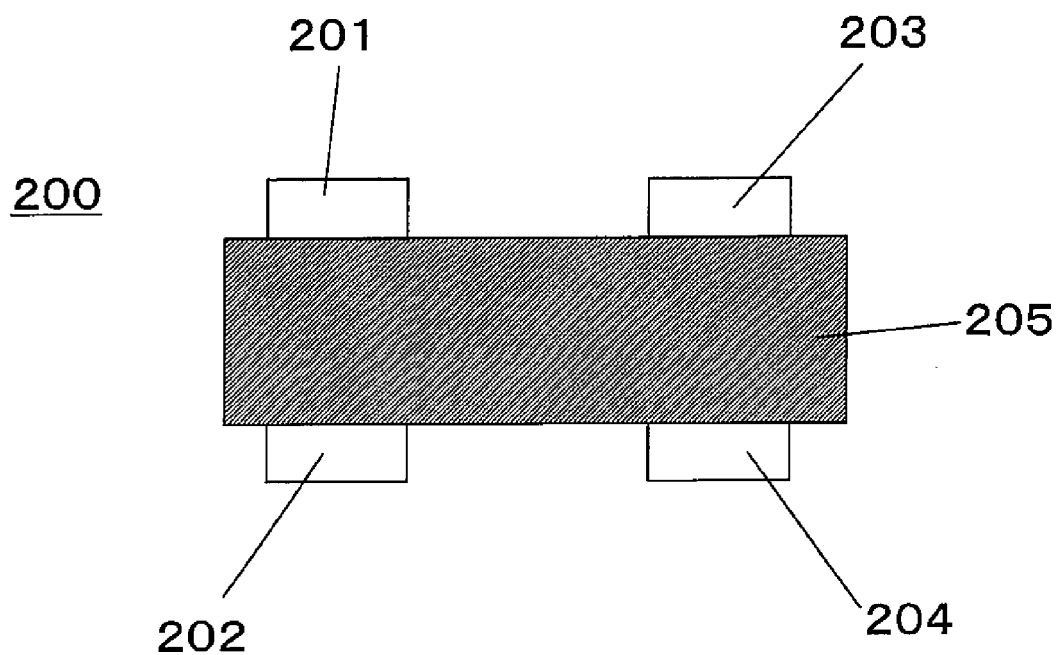
FIG. 6 is a cross-sectional view showing a schematic configuration of an element manufactured in Experiment Example 2 in Embodiment 1 of the present invention.

FIG. 6 is a cross-sectional view showing a schematic configuration of an element manufactured in Experiment Example 2 in Embodiment 1 of the present invention. In the present Experiment Example, as shown in FIG. 6, an element 200 had a structure in which electrodes 202 and 204 comprising Pt underlay an oxygen-deficient Ta oxide layer 205 of 100 nm and electrodes 201 and 203 comprising Pt overlay the oxygen-deficient Ta oxide layer 205. The electrodes 201 and 202 were disposed opposite to each other to sandwich the oxygen-deficient Ta oxide layer 205 between them, while the electrodes 203 and 204 were disposed opposite to each other to sandwich the oxygen-deficient Ta oxide layer 205 between them. The element 200 was an element manufactured only to specify a site of the element where resistance change occurred and was very different in structure from the elements A to C in the above Example. However, the element 200 had basically the same structure as those of the elements A to C in that the oxygen-deficient Ta oxide was sandwiched between electrode materials.

In the present Experiment Example, an electric pulse which was +2.2V in voltage and 100 nsec in pulse width, and an electric pulse which was −1.8V in voltage and 100 nsec in pulse width, were applied alternately to the electrode 201 on the basis of the electrode 202. The element 200 changed to a high-resistance state by applying the electric pulse of +2.2V, while the element 200 changed to a low-resistance state by applying the electric pulse of −1.8V. In each of the low-resistance state and the high-resistance state, the resistance values between two of the four electrodes were measured. To be specific, in a state where +2.2V was applied to the electrode 201 on the basis of the electrode 202 and the resistance value between the electrode 201 and the electrode 202 became high, the resistance value between the electrode 201 and the electrode 202, the resistance value between the electrode 201 and the electrode 203, the resistance value between the electrode 201 and the electrode 204, the resistance value between the electrode 202 and the electrode 203, the resistance value between the electrode 202 and the electrode 204, and the resistance value between the electrode 203 and the electrode 204 were measured. Then, in a state where −1.8V was applied to the electrode 201 on the basis of the electrode 202 and the resistance value between the electrode 201 and the electrode 202 became low, the resistance values between two of the four electrodes were measured in the same manner.

The above-mentioned measurement was repeated 10 times and average values of the measurement resistance values between the electrodes are illustrated in table 1.

TABLE 1

| | Resistance value(Ω) generated by applying +2.2 V to electrode 201 on the basis of electrode 202 | Resistance value(Ω) generated by applying −1.8 V to electrode 201 on the basis of electrode 202 |
|---|---|---|
| Between electrodes 201 and 202 | 546 | 262 |
| Between electrodes 201 and 203 | 1351 | 1276 |
| Between electrodes 201 and 204 | 1075 | 828 |
| Between electrodes 202 and 203 | 1153 | 1153 |
| Between electrodes 202 and 204 | 704 | 704 |
| Between electrodes 203 and 204 | 698 | 698 |

As shown, the resistance values of only the electrode pairs including the electrode 201 changed and the resistance values of the electrode pairs which did not include the electrode 201 did not change. From this fact, it should be understood that resistance value changed only in the region in the vicinity of the electrode 201 in the present Experiment Example.

From the above result, it was found out that in the resistance variable element including the resistance variable layer comprising the oxygen-deficient Ta oxide, resistance values changed only in a region of the oxygen-deficient Ta oxide layer which was located in the vicinity of the electrode. Also, it was found out that the resistance values changed in the region of the oxygen-deficient tantalum oxide layer which was located in the vicinity of the electrode which became a high potential side when the element 200 changed to the high-resistance state (in the present Experiment Example, the electrode 201 was at a high electric potential [+2.2V] relative to the electrode 202, when the element 200 changed to the high-resistance state.

In light of the above result, the results shown in FIG. 4A to 4D will be reviewed again. In all of the Examples shown in FIGS. 4A to 4D, as stated above, the element changed to the high-resistance state by applying the positive voltage to the upper electrode layer on the basis of the lower electrode layer. When this result is combined with the result of the present Experiment Example, it is considered that changing of the resistance values in each of the elements A to C occurred at the upper electrode side, i.e., a region in the vicinity of the interface between the Pt layer and the resistance variable layer, rather than the lower electrode side. As should be understood from the results of FIG. 4A to 4D, the resistance changing operation was not affected by the thickness of the Pt layer.

When these results are combined, it may be presumed that the Pt layer makes some contribution to a change in the resistance value but a degree of the contribution does not depend on the thickness. In other words, it may be presumed that the characteristic of the element is not affected negatively by thinning the Pt layer.

In a structure of each of the elements A to C, TaN was used for the lower electrode layer in order to make it difficult to cause resistance change to occur at the lower electrode layer side, and to measure a genuine electric characteristic at the upper electrode layer side where the Pt layer was provided. In the nonvolatile memory element including the resistance variable layer comprising the transition metal oxide, its resistance changing phenomenon is dependent highly on the material of the electrode, although this will not be explained in detail in the scope of the present invention. As stated above, Pt is a typical material which allows the resistance changing operation to occur easily. On the other hand, TaN is identified as a material which makes it very difficult to cause the resistance changing operation to occur, as compared to Pt.

Experiment Example 3

Role of Second Oxygen-Deficient Ta Oxide Layer

Figure 7A:
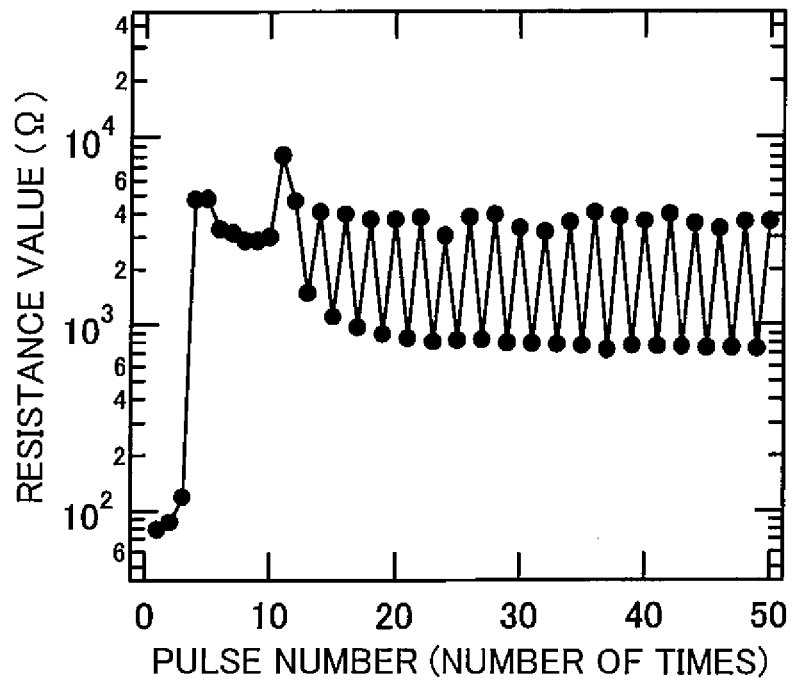
Figure 7B:
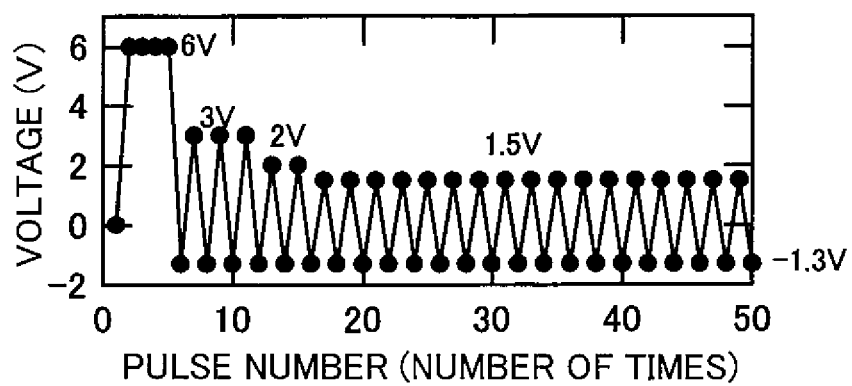

In light of the experimental result shown in Experiment Example 2 (FIG. 6 and table 1), the role of the second oxygen-deficient Ta oxide layer will be described. FIGS. 7A and 7B are views showing a relationship between voltages of electric pulses and resistance values in an element manufactured in Experiment Example 3 in Embodiment 1 of the present invention, in which FIG. 7A is a view showing a relationship between the number of times the electric pulses are applied and the resistance values, and FIG. 7B is a view showing the voltages of the respective electric pulses.

In the present Experiment Example, measurement was made to research a change in the resistance values by applying the electric pulses to an element (hereinafter referred to as element D) having a structure (structure in which the second oxygen-deficient Ta oxide layer formed by oxidization of the surface is omitted) in which the second oxygen-deficient Ta oxide layer was excluded from the structure of FIG. 1.

In the present Experiment Example, the thickness of the Pt layer was set to 13 nm. To be specific, the element D was manufactured in such a manner that the Pt layer of 13 nm was deposited just after the first oxygen-deficient Ta oxide layer was deposited and was identical in structure to the element B except that the second oxygen-deficient Ta oxide layer 105 did not exist in the element D.

As can be seen from the Figures, there was a need for a certain process step to enable the element D to initiate resistance change. To be specific, there was a need for "pre-processing" step in which a voltage of an electric pulse at a positive voltage side was reduced gradually from +6.0V to +1.5V. Finally, the element D exhibited a stable resistance changing operation in such a manner that the resistance value changed to about 3500Ω by applying +1.5V to the element D, and changed to about 750Ω by applying −1.3V.

In contrast, as shown in FIG. 4C, the element B which was similar to the element D exhibited a stable resistance changing operation without performing the "pre-processing" step. Such an electric characteristic difference may be attributed to the presence/absence of the second oxygen-deficient Ta oxide layer. The presence of the second oxygen-deficient Ta oxide layer provides an advantage that the resistance changing operation is implemented easily. As the reason for this, the following mechanism may be suggested although there are still points that are unclear.

The resistance changing operation observed in the resistance variable nonvolatile memory element of this embodiment is a phenomenon in which a region of the resistance variable layer at the upper electrode layer side changes to a high-resistance state by applying a positive voltage to the upper electrode layer and a region of the resistance variable layer at the upper electrode layer side changes to a low-resistance state by applying a negative voltage to the upper electrode layer. From this, it is presumed that the resistance changing operation occurs by migration of oxygen atoms having minus electric charges. To be more specific, by applying the positive voltage to the upper electrode layer, negatively charged oxygen atoms migrate to get together in the region of the resistance variable layer at the upper electrode layer side and form a high-resistance layer, thereby allowing the element to change to the high-resistance state. On the other hand, by applying the negative voltage to the upper electrode layer, oxygen atoms diffuse into the resistance variable layer (oxygen-deficient Ta oxide layer), thereby causing the high-resistance layer to vanish and the element to reduce its resistance.

It is considered that the second oxygen-deficient Ta oxide layer has a role for allowing a voltage to be applied effectively from the start to a site (region of the resistance variable layer which is close to the interface with the electrode) thereof where migration of oxygen should occur and an oxygen migration path to be formed there. That is, a substantially entire part of a voltage applied to the element in an initial state is fed to the second oxygen-deficient Ta oxide layer, because it has a very high-resistance. Thereupon, a portion of the second oxygen-deficient Ta oxide layer is destroyed and its resistance value decreases. It may be presumed that by this destruction, the oxygen migration path is formed. If the second oxygen-deficient Ta oxide layer which is the high-resistance layer is not present in the vicinity of the interface with the electrode, then the voltage is applied uniformly to the entire resistance variable layer, making it difficult to form the oxygen migration path. As a result, the resistance changing phenomenon does not occur easily.

It is considered that even in a structure where the second oxygen-deficient Ta oxide layer is not present, once an oxygen migration path is formed by the "pre-processing" step of applying a higher voltage (voltage of +2V~+6V in the Examples of FIGS. 7A and 7B) than a voltage for operating the element steadily or by applying a number of electric pulses, a stable resistance changing operation will occur thereafter.

From the above study, it is necessary to form the high-resistance second oxygen-deficient Ta oxide layer at a side of the interface with the electrode where the resistance changing operation is caused to occur intentionally. In this embodiment, since the resistance changing operation easily occurs in the region at the upper electrode layer side where the Pt layer is present, the second oxygen-deficient Ta oxide layer is formed at the interface with the upper electrode layer.

An oxygen-deficient Ta oxide layer which is physically in contact with the Pt layer is the second oxygen-deficient Ta oxide layer, an oxygen-deficient Ta oxide layer which is not physically in contact with the Pt layer is the first oxygen-deficient Ta oxide layer, and the second oxygen-deficient Ta oxide layer is sandwiched between the Pt layer and the first oxygen-deficient Ta oxide layer. Oxygen-deficient Ta oxide included in the first oxygen-deficient Ta oxide layer is expressed as $TaO_x$, and oxygen-deficient Ta oxide included in the second oxygen-deficient Ta oxide layer is expressed as $TaO_y$. By satisfying x<y, the resistance of the oxygen-deficient Ta oxide layer at the Pt layer side becomes relatively higher, and the "pre-processing" step can be dispensed with.

Embodiment 2

Embodiment 2 is different from Embodiment 1 in that Ir is used as a material of an electric conductor layer, instead of TiAlN. The reason why TiAlN is used in Embodiment 1 is that the processing of TiAlN is easily performed in the manufacturing process such as dry-etching. Any electric conductor layer material may be used so long as it has an electric conductivity.

A device configuration and a manufacturing method of this embodiment are identical to those of Embodiment 1 except that the electric conductor layer material is different, and will not be descried in detail repetitively.

Example

1. Manufacturing Method

The manufacturing method of the element of the present Example is identical to that of the Example of Embodiment 1 except that the electric conductor layer material is Ir and the thickness of the Pt layer is different. In the present Example, three kinds of nonvolatile memory elements including Pt layers with thicknesses different from each other were manufactured. The thickness of the Pt layer was 5 nm in the element A', 7.5 nm in the element B', and 10 nm in the element C'. The thickness of the electric conductor layer comprising Ir was 20 nm. These elements were heated at 400 degrees C. for 10 minutes in a sintering step.

2. Observation Result of Cross-Section

The cross-sections of the manufactured elements A', B', and C' were observed by TEM.

Figure 8:
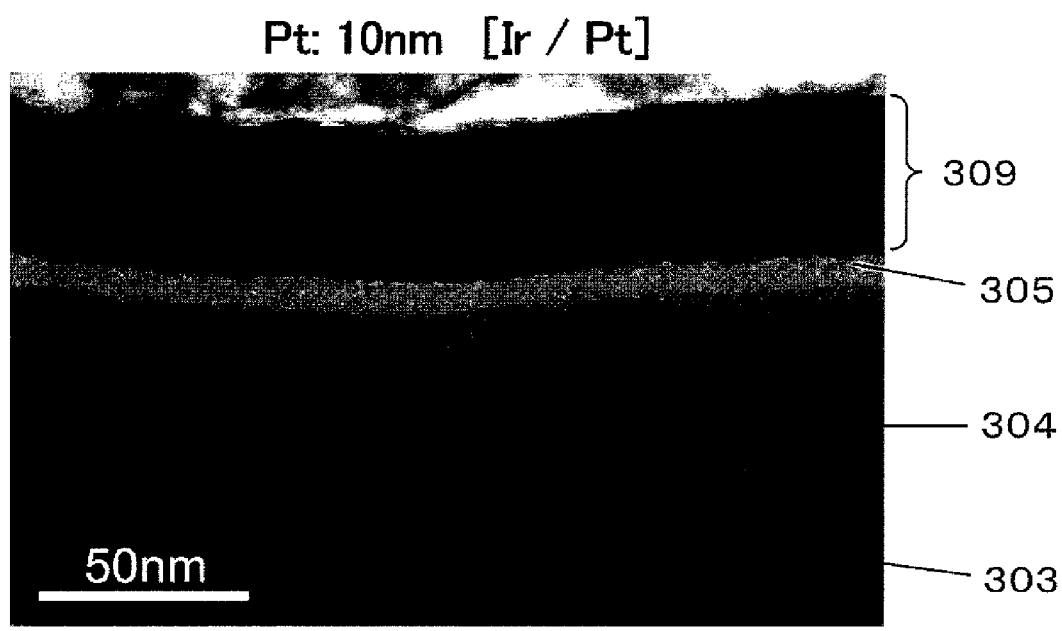
FIG. 8 is a TEM photograph of a cross-section of an element C' manufactured in Example according to Embodiment 2 of the present invention.

FIG. 8 is a TEM photograph of the cross-section of the element C' manufactured in Example according to Embodiment 2 of the present invention. The element C' had a structure in which a lower electrode layer 303, a first oxygen-deficient Ta oxide layer 304, a second oxygen-deficient Ta oxide layer 305, and an upper electrode layer 309 comprising a Pt layer and an electric conductor layer were stacked in this order. Since Ir and Pt were similar in characteristic, it was difficult to distinguish between the electric conductor layer and the Pt layer in FIG. 8.

As shown in FIG. 8, no hillocks appeared on the Pt layer (upper electrode layer 309), even in the element C' (thickness of Pt layer=10 nm) including the Pt layer with a largest thickness. In addition, it was confirmed that no hillocks appeared in the Pt layer (upper electrode layer 309) in the element B' (thickness of Pt layer=7.5 nm) including the Pt layer with a smaller thickness, and in the Pt layer (upper electrode layer 309) in the element A' (thickness of Pt layer=5 nm) including the Pt layer with a smallest thickness. From the above, it was found out that the formation of hillocks could be suppressed by thinning the Pt layer regardless of whether the material of the electric conductor layer was TiAlN or Ir.

3. Initial Resistance

Figure 9:
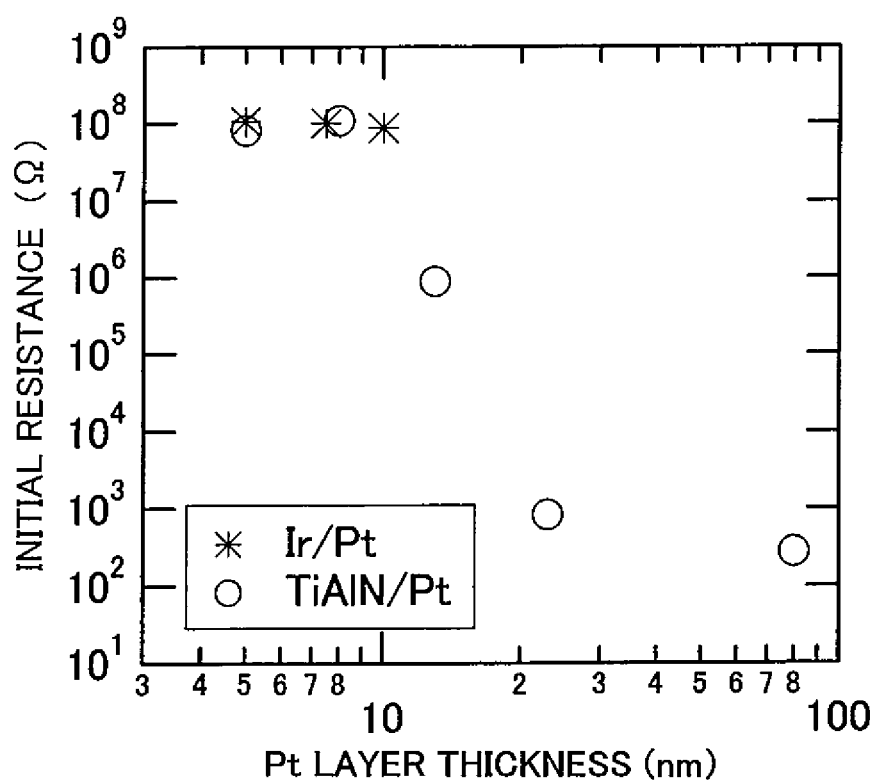
FIG. 9 is a view showing initial resistances of an element A', an element B' and an element C' which are plotted with respect to the thicknesses of a Pt layer, in the Example of Embodiment 2 of the present invention.

FIG. 9 is a view showing initial resistances of the element A', the element B' and the element C' which are plotted with respect to the thicknesses of the Pt layer, in the Example of Embodiment 2 of the present invention. As Comparative Example, data (FIG. 3) in Example of Embodiment 1 are plotted. Definition and measurement method of the initial resistances are identical to those of Examples of Embodiment 1.

As shown in FIG. 9, the initial resistances of the elements A', B', and C' were very high (about $10^8\Omega$), and substantially coincided with the initial resistance of the element A (thickness of Pt layer=8 nm) in the Example of Embodiment 1. Therefore, in the present Example, it was found that the formation of the hillocks were suppressed satisfactorily in all of the elements A', B', and C', like the element A.

In the Example of FIG. 9, $10^8\Omega$ which was the initial resistance of the element including the Pt layer with a thickness of 10 nm or less or the initial resistance of the element including the Pt layer with a thickness of 8 nm or less was substantially equal to a resistance value of a second oxygen-deficient Ta oxide layer (high-resistance layer) with a higher resistivity relative to a first oxygen-deficient Ta oxide layer (low-resistance layer). It was presumed that the initial resistance of the element including the Pt layer with a thickness of 10 nm or less or the initial resistance of the element including the Pt layer with a thickness of 8 nm or less was equal to the resistance value of the second oxygen-deficient Ta oxide layer, because no hillocks were formed on the Pt layer. By setting the thickness of the Pt layer to 10 nm or less or 8 nm or less, the formation of the hillocks can be suppressed substantially completely and the value of the initial resistance can be controlled with higher reliability by changing the composition or thickness of the second oxygen-deficient Ta oxide layer.

4. Resistance Changing Operation

Figure 10A:
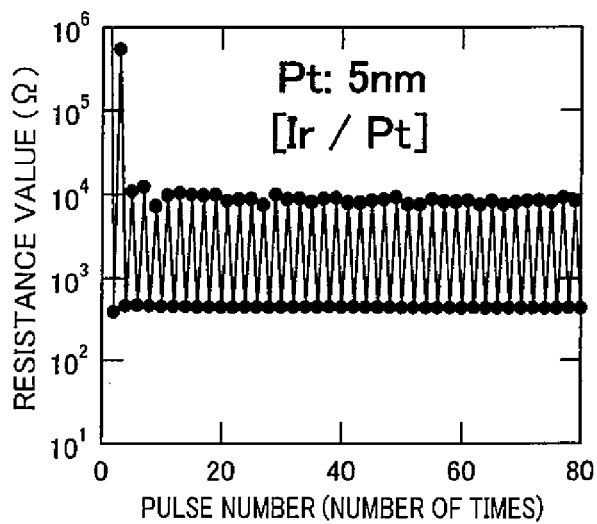
Figure 10B:
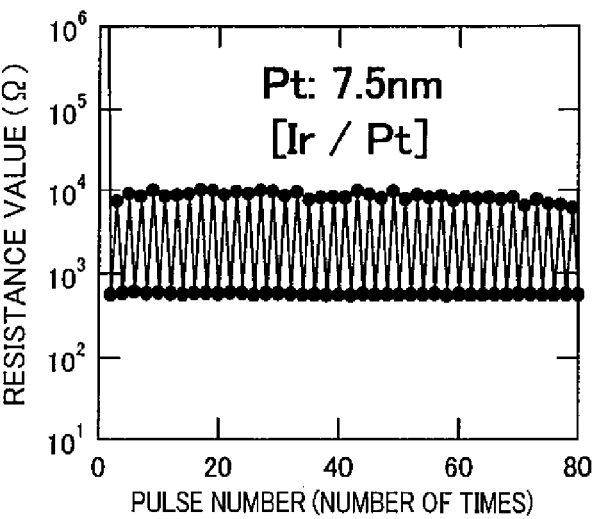
Figure 10C:
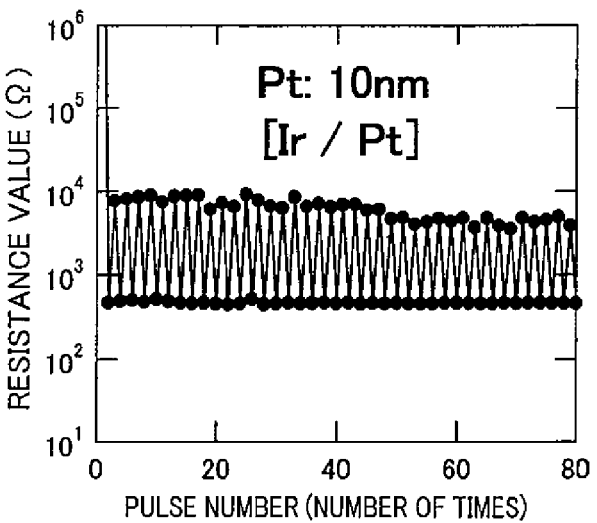

FIG. 10A to 10C are views showing results of verification as to whether or not the element A', the element B' and the element C' perform a resistance changing operation in the Example of Embodiment 2 of the present invention, in which FIG. 10A is a view showing a resistance changing operation of the element A', FIG. 10B is a view showing a resistance changing operation of the element B', and FIG. 10C is a view showing a resistance changing operation of the element C'. An experiment method was similar to that of Example of Embodiment 1.

In the Example of FIG. 10A, the voltages of the electric pulses applied to the element A' were as follows: in first application, −2.5V was applied, in second application, +2.0V was applied, in third application: −1.2V was applied, and in fourth and following applications, +2.0V and −1.2V were alternately applied like the second and following applications. In the Example of FIG. 10A, the resistance value (initial resistance) of the element A' before first pulse application was $10^6\Omega$ or more (beyond measurement range of the apparatus) and was in a range outside FIG. 10A. As can be seen from FIG. 10A, the element A' exhibited a stable resistance changing operation in such a manner that the resistance value of the element A' became about $10000\Omega$ by applying +2.0V and became about $450\Omega$ by applying −1.2V when the pulse number exceeded four in number of times.

In the Example of FIG. 10B, the voltages of the electric pulses applied to the element B' were as follows: in first application, −2.0V was applied, in second application, +2.0V was applied, in third application: −1.2V was applied, and in fourth and following applications, +2.0V and −1.2V were alternately applied like the second and following applications. In the Example of FIG. 10B, the resistance value (initial resistance) of the element B' before the first pulse application was also $10^6\Omega$ or more (beyond measurement range of the apparatus) and was in a range outside FIG. 10B. As can be seen from FIG. 10B, the element B' exhibited a stable resistance changing operation in such a manner that the resistance value of the element B' became about $9000\Omega$ by applying +2.0V and became about $550\Omega$ by applying −1.2V when the pulse number exceeded two in number of times.

In the Example of FIG. 10C, the voltages of the electric pulses applied to the element C' were as follows: in first application, −1.8V was applied, in second application, +2.0V was applied, in third application: −1.2V was applied, and in fourth and following applications, +2.0V and −1.2V were alternately applied like the second and following applications. In the Example of FIG. 10C, the resistance value (initial resistance) of the element C' before first pulse application was also $10^6\Omega$ or more (beyond measurement range of the apparatus) and was in a range outside FIG. 10C. As can be seen from FIG. 10C, the element C' exhibited a stable resistance changing operation in such a manner that the resistance value of the element C' became about $6000\Omega$ by applying +2.0V and became about $450\Omega$ by applying −1.2V when the pulse number exceeded two in number of times.

From the above result, it may be concluded that whether or not the element performs a resistance changing operation does not substantially depend on the thickness of the Pt layer, even in a case where the electric conductor layer comprises Ir.

As described above, even in a case where Ir is used as the material of the electric conductor layer formed on the Pt layer, the formation of the Pt hillocks can be suppressed by thinning the Pt layer and the resistance value can be changed by applying the electric pulses. When the result of Embodiment 1 using TiAlN as the material of the electric conductor layer is combined with the result of this embodiment, it is considered that the electric conductor layer does not affect the formation of the Pt hillocks or the resistance changing phenomenon occurring in response to the electric pulses. That is, Embodiment 2 can achieve advantages similar to those of Embodiment 1.

In principle, the electrode may consist of the Pt layer. But, in this case, there is a problem that it is difficult to process constituents of the element, because of the thin Pt layer, when the element is manufactured (for example, slight over-etching in a dry etching step could etch away the Pt layer and the Pt layer would vanish). For this reason, there is a need for an electric conductor layer to reinforce the thin Pt layer and make it easy to process the constituents. It should be noted that any material may be used as the electric conductor layer so long as it has an electric conductivity.

Modified Examples of Embodiment 1 and Embodiment 2

In Examples of Embodiment 1 and Embodiment 2, as the resistance variable layer, a stacked-layer structure including the first oxygen-deficient Ta oxide having a oxygen content of 58 atm % and a thickness of 23 nm, and the second oxygen-deficient Ta oxide having a oxygen content of 71 atm % and a thickness of 8 nm is used, but such a structure is merely exemplary. As explained in the solution to problem, the formation of hillocks on the Pt layer is a problem common to structures having resistance variable layers comprising transition metal oxide. The method of suppressing the formation of the hillocks proposed in the subject application is based on a mechanism in which growth of grain boundaries is suppressed by thinning the Pt layer, and as a result, migration of Pt is suppressed. It may be considered that such a mechanism is not affected by the material of the resistance variable layer. The method of suppressing the formation of the Pt hillocks of the present invention is applicable to cases where first and second oxygen-deficient Ta oxide layers having compositions and thicknesses other than those mentioned above are used as the resistance variable layers. Furthermore, the method of suppressing the formation of the Pt hillocks of the present invention is applicable to a nonvolatile memory element including the resistance variable layer comprising an oxygen-deficient oxide of transition metal M (e.g., hafnium) other than Ta. In that case, similar advantages are achieved with a similar configuration in which Ta is replaced by a desired transition metal M in the above explained configuration.

In Embodiment 1 and Embodiment 2, a single element of Pt is used as the material of the electrode. The material of the electrode is not limited to Pt, but the formation of the hillocks could be suppressed by thinning the electrode layer even when a material (e.g., alloy containing Pt as a major component and therefore having a characteristic similar to that of the single element metal of Pt) including Pt as a major component is used as the electrode.

Figure 11A:
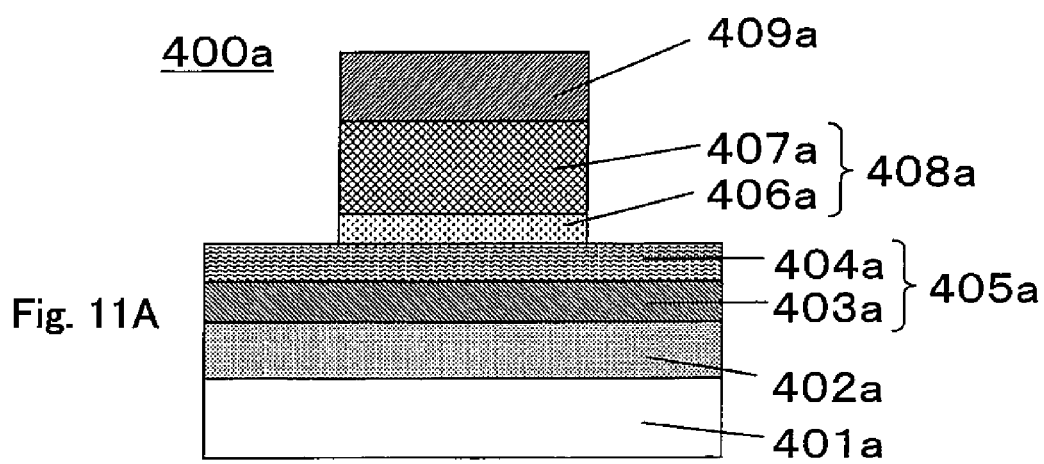
FIGS. 11A and 11B are cross-sectional views showing exemplary schematic configurations of nonvolatile memory elements according to Modified Examples of the present invention.

The element configuration may be such that the structure of FIG. 1 may be reversed in vertical positional relationship. FIG. 11A is a cross-sectional view showing an exemplary schematic configuration of the nonvolatile memory element according to Modified Example 1 of the present invention. A nonvolatile memory element 400a of the present Modified Example includes on a substrate 401a, an oxide layer 402a, a lower electrode layer 405a including an electric conductor layer 403a and a Pt layer 404a, a resistance variable layer 408a including a high-resistance (comparatively more oxidized) second oxygen-deficient Ta oxide layer 406a and a low-resistance (comparatively more reduced) first oxygen-deficient Ta oxide layer 407a, and an upper electrode layer 409a such that these layers are stacked in this order.

When an oxygen-deficient Ta oxide included in the first oxygen-deficient Ta oxide layer 407a is expressed as $TaO_x$ and an oxygen-deficient Ta oxide included in the second oxygen-deficient Ta oxide layer 406a is expressed as $TaO_y$, $0<x<2.5$, $0<y<2.5$, and $x<y$ are satisfied.

In the present Modified Example, the second oxygen-deficient Ta oxide layer cannot be formed by oxidizing the first oxygen-deficient Ta oxide layer. Therefore, for example, it is necessary to control the oxygen content during deposition by sputtering, etc.

Figure 11B:
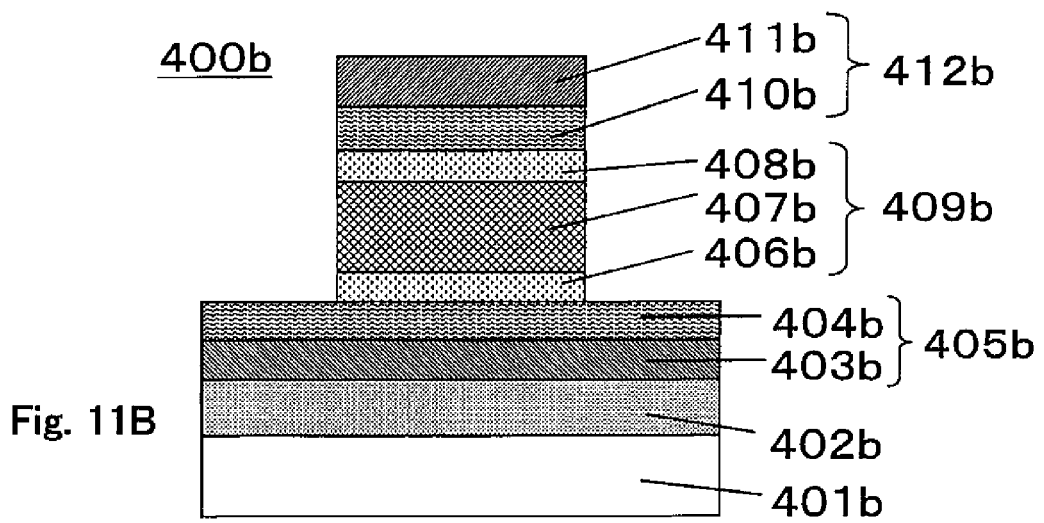

A high-resistance (comparatively more oxidized) oxygen-deficient Ta oxide layer and a Pt layer may be provided at upper and lower sides of a resistance variable layer. FIG. 11B is a cross-sectional view showing an exemplary schematic configuration of a nonvolatile memory element according to Modified Example 2 of the present invention. A nonvolatile memory element 400b of the present Modified Example includes on a substrate 401b, an oxide layer 402b, a lower electrode layer 405b including a lower electric conductor layer 403b and a lower Pt layer 404b, a resistance variable layer 409b including a lower second oxygen-deficient Ta oxide layer 406b, a first oxygen-deficient Ta oxide layer 407b and an upper second oxygen-deficient Ta oxide layer 408b, and an upper electrode layer 412b including an upper Pt layer 410b and an upper electric conductor layer 411b such that these layers are stacked in this order. It should be noted that in this case, a resistance changing operation occurs at both of an upper interface (interface between the upper second oxygen-deficient Ta oxide layer 408b and the upper Pt layer 410b) and a lower interface (interface between lower second oxygen-deficient Ta oxide layer 406b and the lower Pt layer 404b).

The second oxygen-deficient oxide layer 105 may be omitted from the structure of FIG. 1. As should be evident from the measurement result of the element D of FIG. 7A and 7B, the resistance changing operation is implemented in the element from which the second oxygen-deficient oxide layer is omitted, by suitably modifying a method of applying voltages.

Figure 12A:
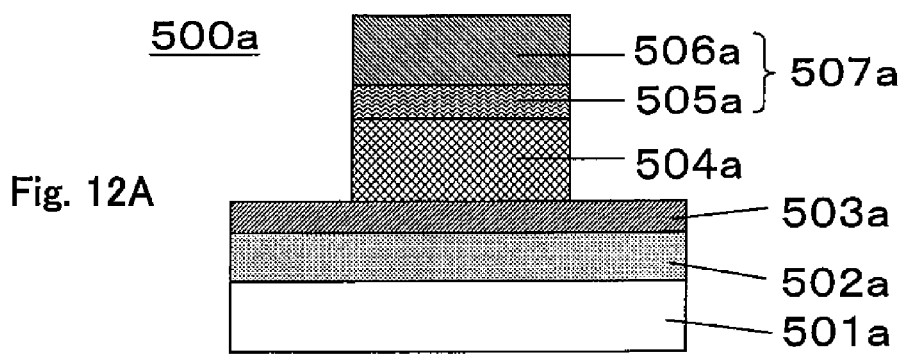
FIG. 12A to 12C are views showing exemplary schematic configurations of nonvolatile memory elements according to Modified Examples of the present invention.
Figure 12B:
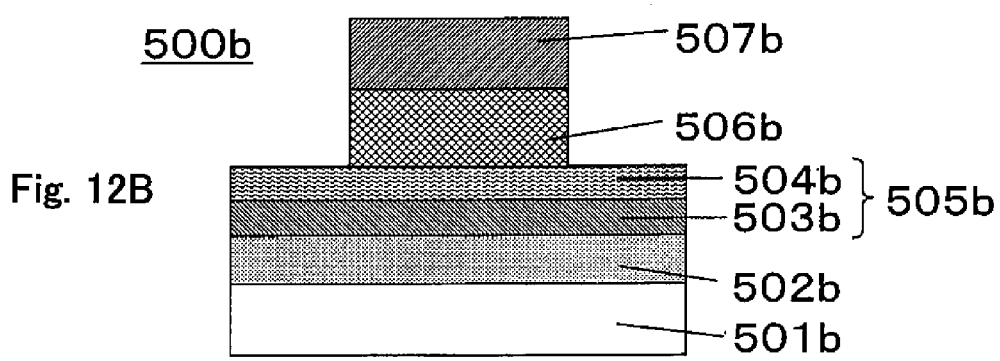
Figure 12C:
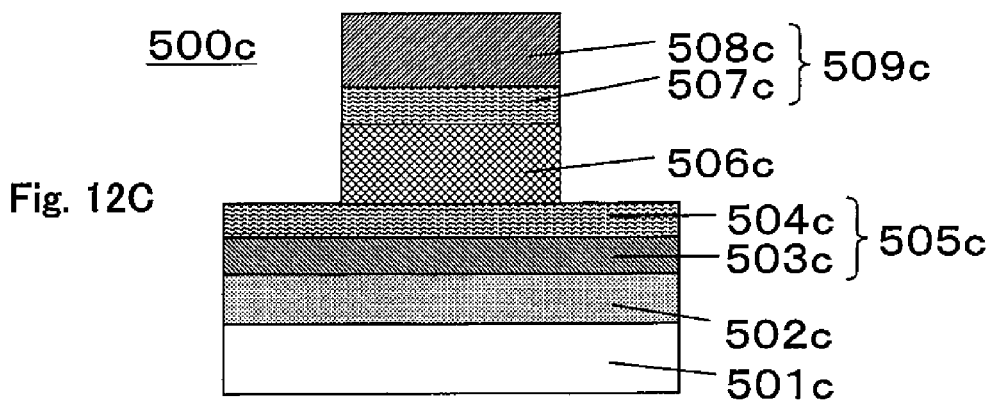
Figure 13:
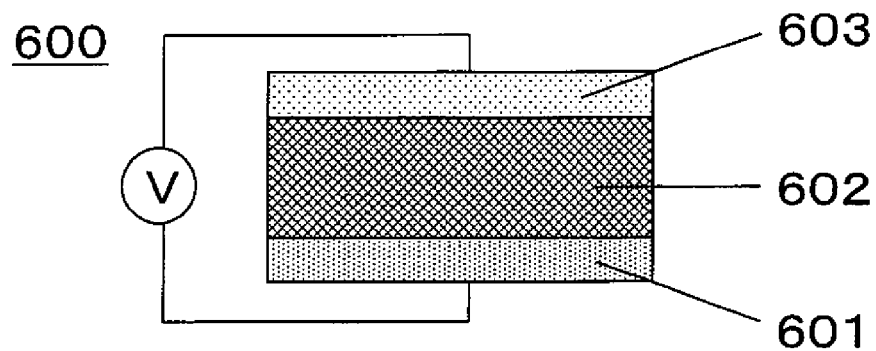
FIG. 13 is a view showing a schematic configuration of a conventional resistance variable nonvolatile memory element.

FIG. 12A to 12B are views showing exemplary schematic configurations of nonvolatile memory elements according to another Modified Examples of the present invention, in which FIG. 12A shows Modified Example 3, FIG. 12B shows Modified Example 4, and FIG. 12C shows Modified Example 5.

A nonvolatile memory element 500a of Modified Example 3 has a structure in which the second oxygen-deficient oxide layer 105 is omitted from the nonvolatile memory element 100 of FIG. 1. The nonvolatile memory element 500a includes on a substrate 501a, an oxide layer 502a, a lower electrode layer 503a, a resistance variable layer 504a, and an upper electrode layer 507a including a Pt layer 505a and an electric conductor layer 506a, such that these layers are stacked in this order.

A nonvolatile memory element 500b of Modified Example 4 has a structure in which the nonvolatile memory element 500a of FIG. 12A is reversed in vertical positional relationship. The nonvolatile memory element 500b includes on a substrate 501b, an oxide layer 502b, a lower electrode layer 505b including an electric conductor layer 503b and a Pt layer 504b, a resistance variable layer 506b and an upper electrode layer 507b such that these layers are stacked in this order.

A nonvolatile memory element 500c of Modified Example 5 has a structure in which the upper second oxygen-deficient Ta oxide layer and the lower second oxygen-deficient Ta oxide layer are omitted from the nonvolatile memory element 400b of FIG. 11B. The nonvolatile memory element 500c includes on a substrate 501c, an oxide layer 502c, a lower electric conductor layer 505c including a lower electric conductor layer 503c and a lower Pt layer 504c, a resistance variable layer 506c, and an upper electrode layer 509c including an upper Pt layer 507c and an upper electric conductor layer 508c such that these layers are stacked in this order.

Although a main portion (upper electrode layer, lower electrode layer and resistance variable layer sandwiched between the upper electrode layer and the lower electrode layer) of the nonvolatile memory element is formed on the oxide layer provided on the substrate, as described above, the present invention is not limited to this. The main portion of the nonvolatile memory element may be provided on a metal wire, or the like.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory element of the present invention is useful as a resistance variable nonvolatile memory element having improved reproducibility of an electric characteristic and improved operation reliability. The nonvolatile memory element of the present invention may be incorporated into a variety of electronic equipment such as digital home appliance, memory cards, cell phones, and personal computers.

REFERENCE SIGNS LISTS 100 nonvolatile memory element
101 substrate
102 oxide layer
103 lower electrode layer
104 first oxygen-deficient Ta oxide layer
105 second oxygen-deficient Ta oxide layer
106 resistance variable layer
107 Pt layer
108 electric conductor layer
109 upper electrode layer
200 element
201, 202, 203, 204 electrode
205 oxygen-deficient Ta oxide layer
303 lower electrode layer
304 first oxygen-deficient Ta oxide layer
305 second oxygen-deficient Ta oxide layer 309 upper electrode layer
400a, 400b nonvolatile memory element
401a, 401b substrate
402a, 402b oxide layer
403a electric conductor layer
403b lower electric conductor layer
404a Pt layer
404b lower Pt layer
405a, 405b lower electrode layer
406a second oxygen-deficient Ta oxide layer
406b lower second oxygen-deficient Ta oxide layer
407a, 407b first oxygen-deficient Ta oxide layer
408a resistance variable layer
408b upper second oxygen-deficient Ta oxide layer
409a upper electrode layer
409b resistance variable layer
410b upper Pt layer
411b upper electric conductor layer
412b upper electrode layer
500a, 500b, 500c nonvolatile memory element
501a, 501b, 501c substrate
502a, 502b, 502c oxide layer
503a lower electrode layer
503b electric conductor layer
503c lower electric conductor layer
504a resistance variable layer
504b Pt layer
504c lower Pt layer
505a Pt layer
505b, 505c lower electrode layer
506a electric conductor layer
506b, 506c resistance variable layer
507a, 507b upper electrode layer
507c upper Pt layer
508c upper electric conductor layer
509c upper electrode layer
600 nonvolatile memory element
601 lower electrode layer
602 resistance variable layer
603 upper electrode layer
703a, 703b, 703c, 703d lower electrode layer
704a, 704b first oxygen-deficient Ta oxide layer
705a, 705b second oxygen-deficient Ta oxide layer
706c, 706d oxygen-deficient Hf oxide layer
709a, 709b, 709c, 709d upper electrode layer

The invention claimed is:

1. A nonvolatile memory element comprising:
a first electrode;
a second electrode; and
a resistance variable layer disposed between the first electrode and the second electrode, resistance values of the resistance variable layer reversibly changing in response to electric signals applied between the first electrode and the second electrode, wherein:
the resistance variable layer comprises an oxygen-deficient transition metal oxide which is a transition metal oxide and is less in oxygen content which is an atom ratio than an oxide having a stoichiometric composition,
at least one of the first electrode and the second electrode includes a platinum-containing layer comprising platinum or a platinum alloy,
the oxygen-deficient transition metal oxide in the resistance variable layer includes at least a first oxygen-deficient transition metal oxide layer which is not physically in contact with the platinum-containing layer and a second oxygen-deficient transition metal oxide layer which is disposed between the first oxygen-deficient transition metal oxide layer and the platinum-containing layer and is physically in contact with the platinum-containing layer,
$x < y$ is satisfied when an oxygen-deficient transition metal oxide included in the first oxygen-deficient transition metal oxide layer is expressed as $MO_x$, and an oxygen-deficient transition metal oxide included in the second oxygen-deficient transition metal oxide layer is expressed as $MO_y$, and
the platinum-containing layer has a thickness which is not less than 1 nm and not more than 23 nm.

2. The nonvolatile memory element according to claim 1, wherein:
the oxygen-deficient transition metal oxide has an upper surface subjected to an oxidization process after the oxygen-deficient transition metal oxide is deposited,
the second oxygen-deficient transition metal oxide layer is a portion of the oxygen-deficient transition metal oxide, which has been subjected to the oxidization process, and
the first oxygen-deficient transition metal oxide layer is a portion of the oxygen-deficient transition metal oxide, which is other than the portion having been subjected to the oxidization process.

3. The nonvolatile memory element according to claim 1, wherein the transition metal is tantalum.

4. The nonvolatile memory element according to claim 2, wherein the transition metal is tantalum.

5. The nonvolatile memory element according to claim 1, wherein the platinum-containing layer has a thickness which is not less than 1 nm and not more than 8 nm.

* * * * *